(12) United States Patent
Kawaguchi et al.

(10) Patent No.: US 11,152,580 B2
(45) Date of Patent: Oct. 19, 2021

(54) FLEXIBLE DISPLAY DEVICE

(71) Applicant: Sharp Kabushiki Kaisha, Sakai (JP)

(72) Inventors: Tsuyoshi Kawaguchi, Sakai (JP); Ryoh Araki, Sakai (JP); Taketoshi Nakano, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 73 days.

(21) Appl. No.: 16/498,488

(22) PCT Filed: Mar. 30, 2017

(86) PCT No.: PCT/JP2017/013238
§ 371 (c)(1),
(2) Date: Sep. 27, 2019

(87) PCT Pub. No.: WO2018/179214
PCT Pub. Date: Oct. 4, 2018

(65) Prior Publication Data
US 2021/0111357 A1    Apr. 15, 2021

(51) Int. Cl.
*H01L 51/00* (2006.01)
*H01L 27/32* (2006.01)
*H01L 51/52* (2006.01)

(52) U.S. Cl.
CPC ........ *H01L 51/0097* (2013.01); *H01L 27/323* (2013.01); *H01L 27/3244* (2013.01); *H01L 51/5253* (2013.01); *H01L 51/5281* (2013.01); *H01L 2251/5338* (2013.01)

(58) Field of Classification Search
CPC ............. H01L 51/0097; H01L 51/5253; H01L 51/5281; H01L 27/323; H01L 27/3244
See application file for complete search history.

(56) References Cited

U.S. PATENT DOCUMENTS

| | | |
|---|---|---|
| 2006/0202206 A1 | 9/2006 | Koyama et al. |
| 2010/0090975 A1 | 4/2010 | Nagata et al. |
| 2014/0226275 A1 | 8/2014 | Ko et al. |
| 2014/0285992 A1 | 9/2014 | Yang et al. |
| 2015/0144921 A1* | 5/2015 | Lim .................. H01L 51/5281 257/40 |
| 2015/0261254 A1 | 9/2015 | Hiroki et al. |
| 2015/0378391 A1 | 12/2015 | Huitema et al. |
| 2016/0070304 A1 | 3/2016 | Shin et al. |
| 2016/0155967 A1* | 6/2016 | Lee .................... H01L 27/323 257/88 |

(Continued)

FOREIGN PATENT DOCUMENTS

| | | |
|---|---|---|
| JP | 2001-255513 A | 9/2001 |
| JP | 2008-107440 A | 5/2008 |

(Continued)

OTHER PUBLICATIONS

Official Communication issued in International Patent Application No. PCT/JP2017/013238, dated Jun. 27, 2017.

*Primary Examiner* — Christine A Enad
(74) *Attorney, Agent, or Firm* — Keating & Bennett, LLP

(57) ABSTRACT

Provided is a flexible display device in which an average thickness of a layered body, a touch panel, and a polarizing plate in a bending region is thinner than an average thickness of the layered body, the touch panel, and the polarizing plate in a region other than the bending region.

19 Claims, 14 Drawing Sheets

(56) References Cited

U.S. PATENT DOCUMENTS

| | | | |
|---|---|---|---|
| 2016/0168432 A1 | 6/2016 | You et al. | |
| 2016/0231837 A1* | 8/2016 | Baek | G09G 3/3225 |
| 2017/0294495 A1* | 10/2017 | Shyu | H01L 27/3276 |
| 2018/0027673 A1* | 1/2018 | Andou | H01L 51/0097 |
| | | | 361/749 |
| 2018/0175310 A1* | 6/2018 | Lee | B32B 27/308 |

FOREIGN PATENT DOCUMENTS

| | | |
|---|---|---|
| JP | 2012-227530 A | 11/2012 |
| JP | 2014-161009 A | 9/2014 |
| JP | 2014-182306 A | 9/2014 |
| JP | 2015-187858 A | 10/2015 |
| JP | 2016-059030 A | 4/2016 |
| JP | 2016-113611 A | 6/2016 |
| JP | 2017-504204 A | 2/2017 |
| WO | 2007/026764 A1 | 3/2007 |
| WO | 2015/100396 A1 | 7/2015 |

* cited by examiner

FLEXIBLE DISPLAY DEVICE

TECHNICAL FIELD

The disclosure relates to a flexible display device (a flexible display).

BACKGROUND ART

In recent years, various flat panel displays have been developed. Particularly, organic Electro luminescence (EL) display devices, reflection-type liquid crystal display devices not provided with a backlight, and the like have attracted much attention as flexible display devices that are freely bendable.

PTL 1 discloses a flexible mobile terminal device provided with a flexible display and a folding portion including a concave-convex structure, and describes that such a flexible mobile terminal device can be freely bent and straightened.

CITATION LIST

Patent Literature

PTL 1: JP 2014-161009 A (published on Sep. 4, 2014)

SUMMARY

Technical Problem

Nevertheless, in the flexible mobile terminal device described in PTL 1, while a folding portion that is a separate member from the flexible display (flexible display device) is provided with a concave-convex structure, the flexible display itself is a known flexible display.

Such a known flexible display includes a layered film provided with a display element, a touch panel, a polarizing plate, and a protection layer. These components, however, do not employ a structure for improving bending characteristics.

Therefore, in the case of a known flexible display provided in the flexible mobile terminal device described in PTL 1, the flexible display has excellent repeated flexibility, but when fixed for an extended period of time in a bent state, the problem arises that the flexible mobile terminal device remains bent without being restored to the original shape, resulting in residual bending marks.

In light of the problems described above, an object of the disclosure is to provide a flexible display device with improved bending characteristics such as restoring force, bending mark resistance, and flexibility after being fixed for an extended period of time in a bent state.

Solution to Problem

A flexible display device according to the disclosure, to solve the above-described problems, includes a layered body including a flexible substrate and a plurality of electro-optical elements provided on a surface on one side of the flexible substrate, and a protection layer as a top layer configured to cover the layered body. When a plurality of layers including the layered body being a lower layer below the protection layer as well as the protection layer are bent to align two end portions opposing each other, a portion formed in a non-planar manner on a side opposing the two end portions is a bending region and, in at least one layer of the plurality of layers, an opening or a recessed and protruding portion is formed in at least a portion of the bending region of the at least one layer of the plurality of layers.

According to the configuration described above, in at least one layer of the plurality of layers, an opening or a recessed and protruding portion is formed in at least a portion of the bending region of the at least one layer of the plurality of layers, making it possible to reduce a stress applied to the bending region of the flexible display device during bending, and thus achieve a flexible display device with improved bending characteristics such as restoring force, bending mark resistance, and flexibility after being fixed for an extended period of time in a bent state.

A flexible display device according to the disclosure, to solve the above-described problems, includes a layered body including a flexible substrate and a display element provided on a surface on one side of the flexible substrate, and a protection layer as a top layer configured to cover the layered body. When a plurality of layers including the layered body being a lower layer below the protection layer as well as the protection layer are bent to align two end portions opposing each other, a portion formed in a non-planar manner on a side opposing the two end portions is a bending region, an opening is formed in at least a portion of the bending region of at least one of the plurality of layers, and a gel material is formed in the opening.

According to the above-described configuration, a gel material is formed in an opening of the bending region of the flexible display device, making it possible to reduce a stress applied to the bending region of the flexible display device during bending, and thus achieve a flexible display device with improved bending characteristics such as restoring force, bending mark resistance, and flexibility after being fixed for an extended period of time in a bent state.

Advantageous Effects of Disclosure

According to an aspect of the disclosure, it is possible to provide a flexible display device with improved bending characteristics such as restoring force, bending mark resistance, and flexibility after being fixed for an extended period of time in a bent state.

DESCRIPTION OF EMBODIMENTS

Figure 1:
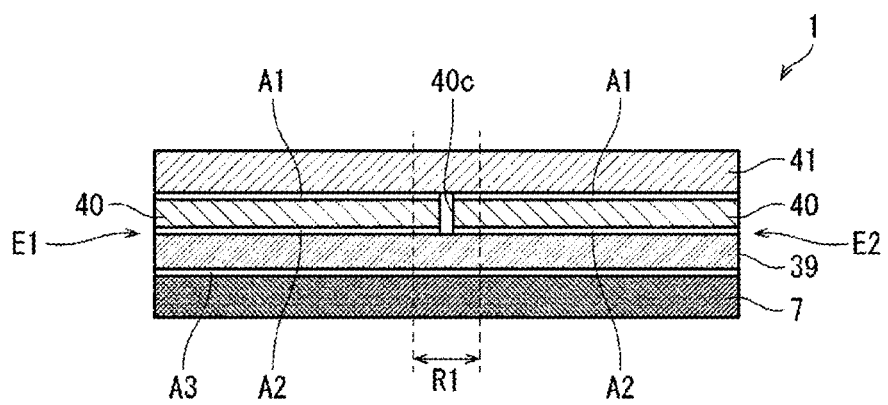
FIG. 1 is a diagram illustrating a schematic configuration of a flexible organic EL display device.

A description follows regarding embodiments of the disclosure, with reference to FIG. 1 to FIG. 14. Hereinafter, for convenience of description, components having the same functions as those described in a specific embodiment are denoted by the same reference numerals, and descriptions thereof may be omitted.

First Embodiment

A first embodiment of the disclosure will be described with reference to FIG. 1 to FIG. 6.

Note that, in the following embodiments, a flexible organic Electro luminescence (EL) display device is described as an example of a flexible display device (flexible display). However, the flexible display device is not limited thereto, and may be a flexible reflection-type liquid crystal display device not provided with a backlight, or the like.

FIG. 1 is a diagram illustrating a schematic configuration of a flexible organic EL display device 1.

As illustrated, the flexible organic EL display device 1 includes a layered body 7 including a flexible substrate (not illustrated) and an electro-optical element (not illustrated) provided on a surface of one side of the flexible substrate, and a protection layer 41 as a top layer configured to cover the layered body 7. A plurality of layers including the layered body 7 being a lower layer below the protection layer 41 includes the layered body 7, adhesive layers A1 to A3, a touch panel 39, and a polarizing plate 40.

The flexible organic EL display device 1 includes two end portions opposing each other, namely a left end portion E1 and a right end portion E2.

When the flexible organic EL display device 1 is bent to align the left end portion E1 and the right end portion E2 (refer to FIG. 4C), a portion formed in a non-planar manner on a side opposing the left end portion E1 and the right end portion E2 is a bending region R1 indicated by the dashed lines in the drawings.

Then, an opening 40c is formed in at least a portion of the bending region R1 of the polarizing plate 40.

Figure 2:
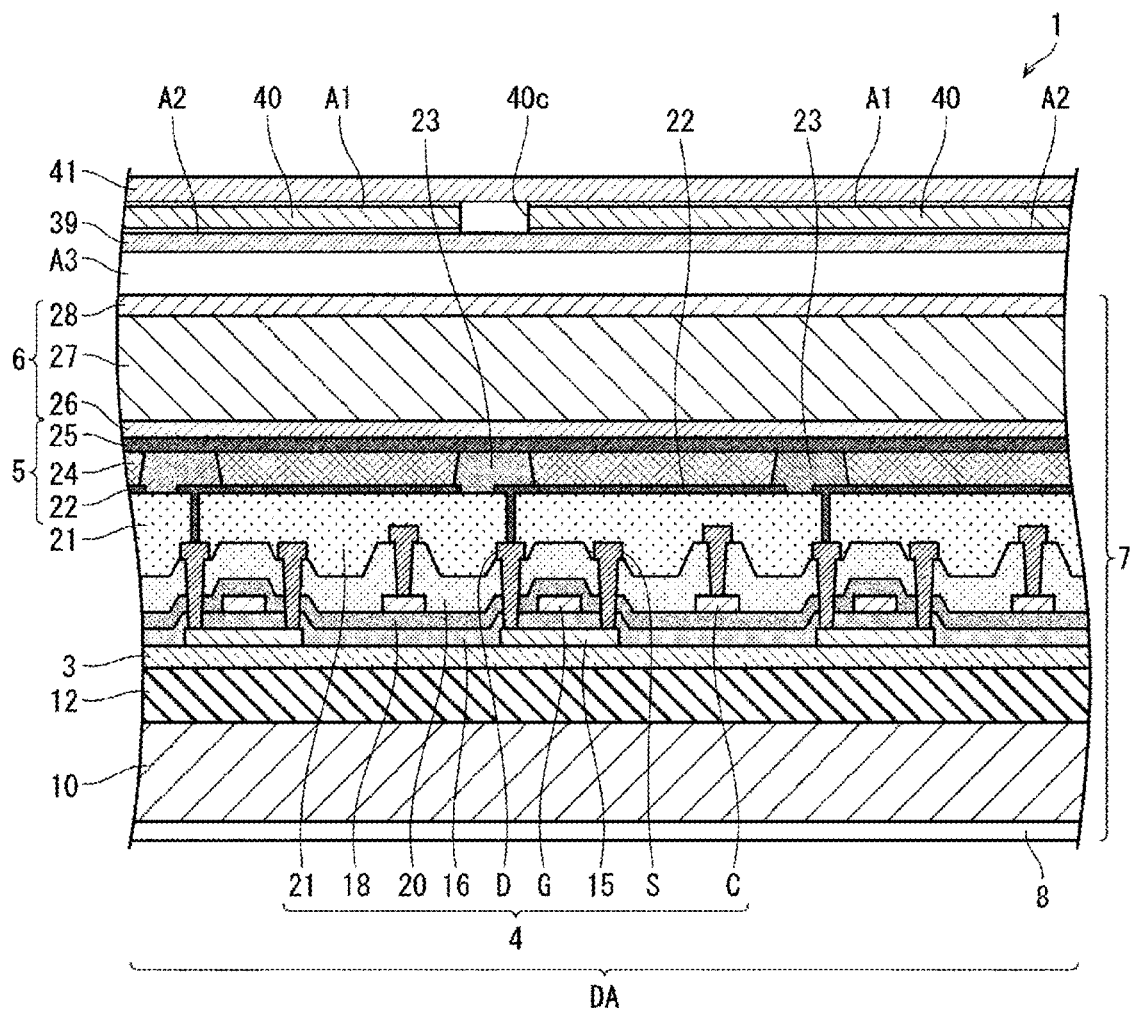
FIG. 2 is a diagram illustrating a schematic configuration of a display region of the flexible organic EL display device.

FIG. 2 is a diagram illustrating a schematic configuration of a display region DA of the flexible organic EL display device 1.

As illustrated, a resin layer 12 is formed on a flexible substrate 10, and a barrier layer 3 is formed on the resin layer 12. Then, a thin-film transistor (TFT) layer 4 including a gate insulating film 16, passivation films 18 and 20, and an organic interlayer film 21 is formed on the barrier layer 3. Then, on the TFT layer 4, an organic EL light-emitting element 5 serving as an electro-optical element is formed. Then, a sealing layer 6 including inorganic sealing films 26 and 28 and an organic sealing film 27 is formed to cover the organic EL light-emitting element 5.

Note that, in the present embodiment, a layered body obtained by layering a graphite sheet, a copper foil, and a foam cushion sheet is separately bonded as a lower layer 8 of the flexible substrate 10, and the layers from the lower layer 8 of the flexible substrate 10 to the inorganic sealing film 28 are referred to as the layered body 7.

As the lower layer 8 of the flexible substrate 10, a layered body obtained by layering a graphite sheet, a copper foil, and a foam cushion sheet in this order from the flexible substrate 10 side may be used, or a layered body obtained by changing the layering order as appropriate may be used. Furthermore, a layered body obtained by layering only a graphite sheet and a copper foil may be used, or a single body of only a graphite sheet may be used.

That is, as the lower layer 8 of the flexible substrate 10, a layer including at least one layer of a graphite sheet, a copper foil, and a foam cushion sheet may be used.

The lower layer 8 of the flexible substrate 10 may be included as necessary or omitted as appropriate.

The touch panel 39 is bonded on this layered body 7 via the adhesive layer A3 made of an Optical Clear Adhesive (OCA) or an Optical Clear Resin (OCR), and the polarizing plate 40 including the opening 40c is bonded on the touch panel 39 via the adhesive layer A2 made of a glue or the like having a thickness of about from 10 μm to 20 μm, for example. Then, the protection layer 41 is bonded on the polarizing plate 40 as a top layer via the adhesive layer A1 made of OCA or OCR.

A cover glass or film material (window film, for example) may be used as the protection layer 41, and a base material of the cover glass may be glass, acrylic resin, polyethylene terephthalate (PET) resin, or the like. Further, a base material of the film material may be a resin such as PET, polyimide (PI), triacetyl cellulose (TAC), polyethylene naphthalate (PEN), polycarbonate (PC), or cyclo olefin copolymer (COP).

Further, decorative printing may be applied to a back face of the protection layer 41, that is, on the face opposing the polarizing plate 40.

Further, a base material of the touch panel 39 may be a resin such as PET, PI, TAC, PEN, PC, or COP.

Although not illustrated, an electronic circuit board is mounted on an end portion of the TFT layer 4.

Note that examples of the material of the flexible substrate 10 include a film made of PET or the like, and examples of the material of the resin layer 12 include polyimide, epoxy, polyamide, or the like.

The barrier layer 3 is a layer that inhibits moisture or impurities from reaching the TFT layer 4 or the organic EL light-emitting element 5 when a flexible organic EL display device 1 is being used, and may be constituted, for example, by a silicon oxide film, a silicon nitride film, or a silicon oxynitride film, or by a layered film of these films, formed using chemical vapor deposition (CVD).

The TFT layer 4 includes a semiconductor film 15, a gate insulating film 16 formed in a layer above the semiconductor film 15, a gate electrode G formed in a layer above the gate insulating film 16, the passivation films 18 and 20 formed in a layer above the gate electrode G, a capacitance electrode C and a terminal (not illustrated) formed in a layer above the passivation film 18, a source wiring line S and a drain wiring line D formed in a layer above the passivation film 20, and the organic interlayer film (flattening film) 21 formed in a layer above the source wiring line S and the drain wiring line D. A TFT is configured to include the semiconductor film 15, the gate insulating film 16, and the gate electrode G. Note that, in a non-display region of the TFT layer 4 (not illustrated), a plurality of terminals used for connection with an electronic circuit board are formed.

The semiconductor film 15 is formed of low-temperature polysilicon (LTPS) or an oxide semiconductor, for example. The gate insulating film 16 may be configured by a silicon oxide (SiOx) film, a silicon nitride (SiNx) film, or a layered film thereof formed using a CVD method, for example. The gate electrode G, the source electrode S, the drain electrode D, and the terminal are formed of a single layer film or a layered film of metal including, for example, at least one of aluminum (Al), tungsten (W), molybdenum (Mo), tantalum (Ta), chromium (Cr), titanium (Ti), or copper (Cu). Note that, although the TFT provided with the semiconductor film 15 as the channel is illustrated as having a top gate structure in FIG. 2, the TFT may have a bottom gate structure (when the TFT channel is an oxide semiconductor, for example).

The gate insulating film 16 and the passivation films 18 and 20 may be configured by a silicon oxide (SiOx) film, a silicon nitride (SiNx) film, or a layered film thereof, formed using a CVD method, for example. The organic interlayer film 21 may be configured by a coatable photosensitive organic material, such as polyimide or acrylic, for example. Note that an edge of the terminal (not illustrated) is covered with the organic interlayer film 21.

A first electrode 22 (for example, an anode electrode), an organic insulating film 23 covering an edge of the first electrode 22, an EL layer 24 including a light-emitting layer formed in a layer above the first electrode 22, and a second electrode 25 formed in a layer above the EL layer 24 are formed above the organic interlayer film 21, and the first electrode 22, the EL layer 24, and the second electrode 25 constitute the organic EL light-emitting element 5. The organic insulating film 23 in the display region DA functions as a bank (pixel partition) that defines subpixels.

Note that, while preferably the polarizing plate 40 is disposed relative to the organic insulating film 23 such that the opening 40c in the polarizing plate 40 overlaps with the organic insulating film 23 in a plan view in the present embodiment, the disclosure is not limited thereto.

Further, in a case of a flexible reflection-type liquid crystal display device, preferably the polarizing plate 40 is disposed relative to a black matrix layer (BM layer) provided on a reflection-type liquid crystal display element such that the opening 40c in the polarizing plate 40 overlaps with the BM layer in a plan view.

Note that the organic insulating film 23 may be made of a coatable photosensitive organic material such as polyimide or acrylic, for example.

The EL layer 24 including the light-emitting layer is formed in a region (subpixel region) surrounded by the organic insulating film 23 using a vapor deposition method or an ink-jet method. When an electro-optical element is the organic EL light-emitting element 5, the EL layer 24, which includes the light-emitting layer, is formed by layering a hole injection layer, a hole transport layer, a light-emitting layer, an electron transport layer, and an electron injection layer sequentially from the lower layer side, for example. Note that one or more EL layers 24 may be a common layer (shared by a plurality of pixels).

The first electrode (anode) 22 is formed by a layering of, for example, Indium Tin Oxide (ITO) and an alloy including silver (Ag), and has light reflectivity. The second electrode (for example, a cathode) 25 is a common electrode, and may be formed of a transparent metal such as ITO or Indium Zinc Oxide (IZO).

Holes and electrons are recombined in the EL layer 24 by a driving current between the first electrode 22 and the second electrode 25 in the organic EL light-emitting element 5, and the excitons generated thereby fall to the ground state such that light is emitted.

The sealing layer 6 covers the organic EL light-emitting element 5 and prevents penetration of foreign matter, such as water and oxygen, into the organic EL light-emitting element 5. The sealing layer 6 includes the first inorganic sealing film 26 covering the organic insulating film 23 and the second electrode 25, an organic sealing film 27 that is formed in a layer above the first inorganic sealing film 26 and functions as a buffer film, and the second inorganic sealing film 28 covering the first inorganic sealing film 26 and the organic sealing film 27.

Each of the first inorganic sealing film 26 and the second inorganic sealing film 28 may be a silicon oxide film, a silicon nitride film, a silicon oxynitride film, or a layered film thereof formed by CVD using a mask. The organic sealing film 27 is a transparent organic insulating film that is thicker than the first inorganic sealing film 26 and the second inorganic sealing film 28, and may be formed of a coatable photosensitive organic material such as polyimide or acrylic. For example, after the first inorganic sealing film 26 is coated, by an ink-jet method, with an ink containing such an organic material, the ink is cured by ultraviolet (UV) irradiation.

Figure 3A:
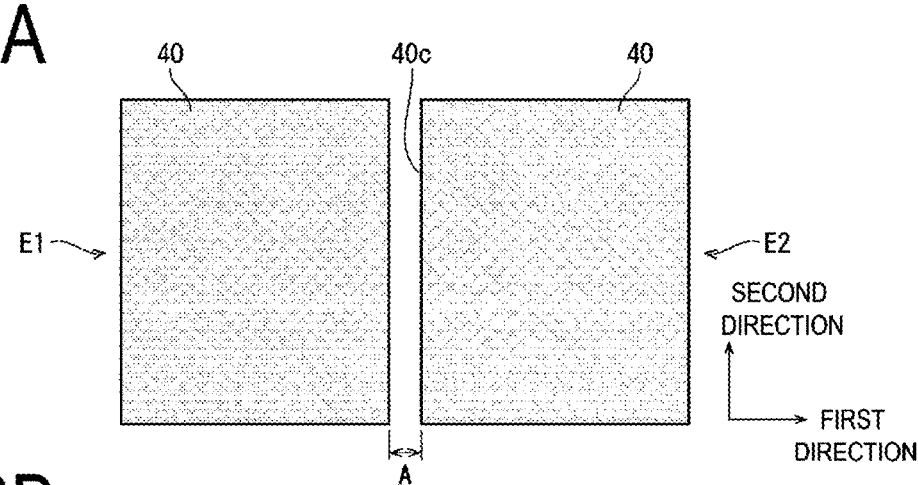
FIG. 3A illustrates a polarizing plate provided to the flexible organic EL display device.
Figure 3B:
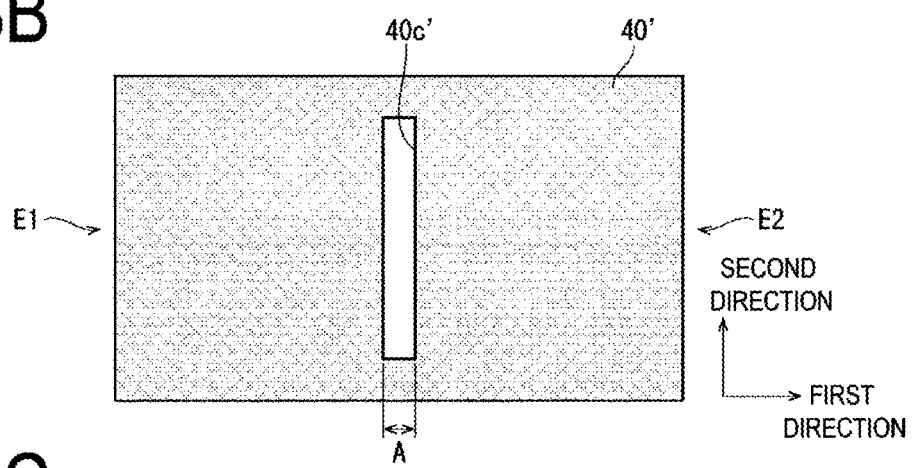
FIGS. 3B and 3C illustrate polarizing plates as modified examples thereof.
Figure 3C:
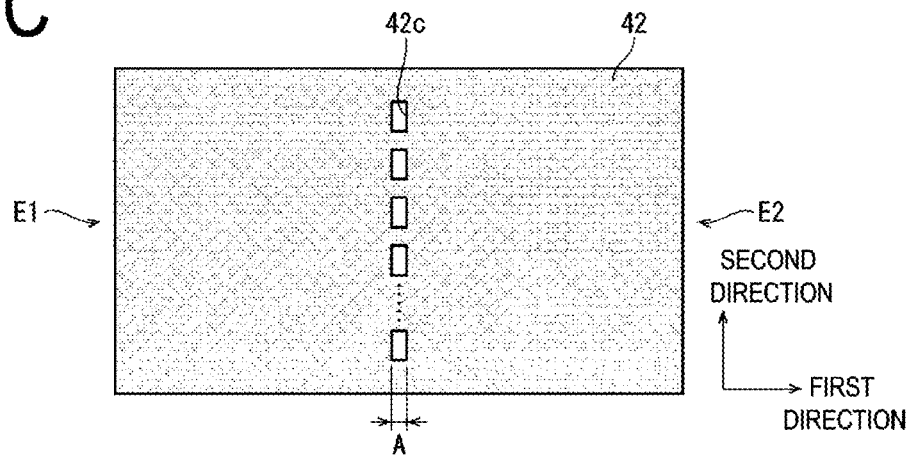

FIG. 3A illustrates the polarizing plate 40 provided to the flexible organic EL display device 1, and FIGS. 3B and 3C illustrate polarizing plates 40' and 42 as a modified examples thereof.

As illustrated in FIG. 3A, the polarizing plate 40 provided to the flexible organic EL display device 1 is split into two by the one opening 40c formed in at least a portion of the bending region R1 (not illustrated).

Note that a first direction in the drawing is a direction orthogonal to each of the two end portions opposing each other, namely the left end portion E1 and the right end portion E2, and a second direction is a direction orthogonal to the first direction.

A width of the opening 40c of the polarizing plate 40 in the first direction is a predetermined value A, and a method for determining this predetermined value A will be described later.

That is, in the flexible organic EL display device 1, the two split polarizing plates 40 are disposed apart in the first direction by a width of the predetermined value A, and a space portion (a space portion having a width of the predetermined value A in the first direction) between the two polarizing plates 40 is formed in at least a portion of the bending region R1 (not illustrated) of the polarizing plates 40.

FIG. 3B illustrates a shape of the other polarizing plate 40' that can be provided to the flexible organic EL display device 1. In the polarizing plate 40', one opening 40c' is formed in at least a portion of a bending region R1' (not illustrated).

A width of the opening 40c' of the polarizing plate 40' in the first direction is the predetermined value A, and the method for determining this predetermined value A will be described later.

FIG. 3C illustrates a shape of the other polarizing plate 42 that can be provided to the flexible organic EL display device 1. In the polarizing plate 42, a plurality of openings 42c are formed in at least a portion of the bending region R1 (not illustrated) in the second direction.

A width of each of the plurality of openings 42c of the polarizing plate 42 in the first direction is the predetermined value A, and the method for determining this predetermined value A will be described later.

FIGS. 4A to 4D are diagrams for explaining why the flexible organic EL display device 1 exhibits improvement in bending characteristics such as restoring force, bending mark resistance, and flexibility after being fixed for an extended period of time in a bent state, and a method for determining the preferred predetermined value A of the width of the opening formed in the polarizing plate in the first direction.

Note that, in FIGS. 4A to 4D, the adhesive layers A1 to A3 are not illustrated.

Figure 4A:
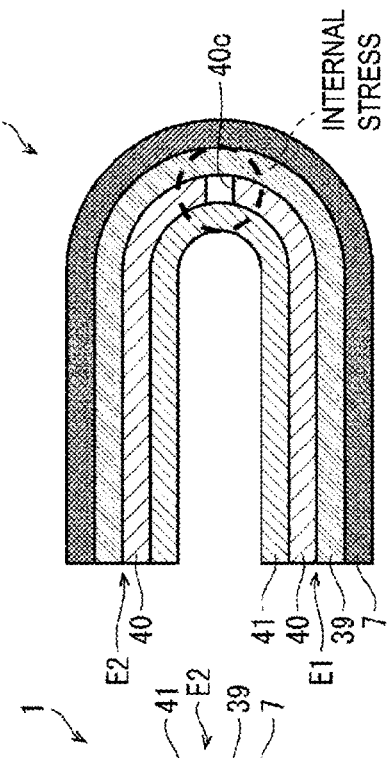
FIGS. 4A to 4D are diagrams for explaining why the flexible organic EL display device exhibits improvement in bending characteristics such as restoring force, bending mark resistance, and flexibility after being fixed for an extended period of time in a bent state, and a method for determining a preferred predetermined value A of a width of an opening formed in the polarizing plate in a first direction.
Figure 4B:
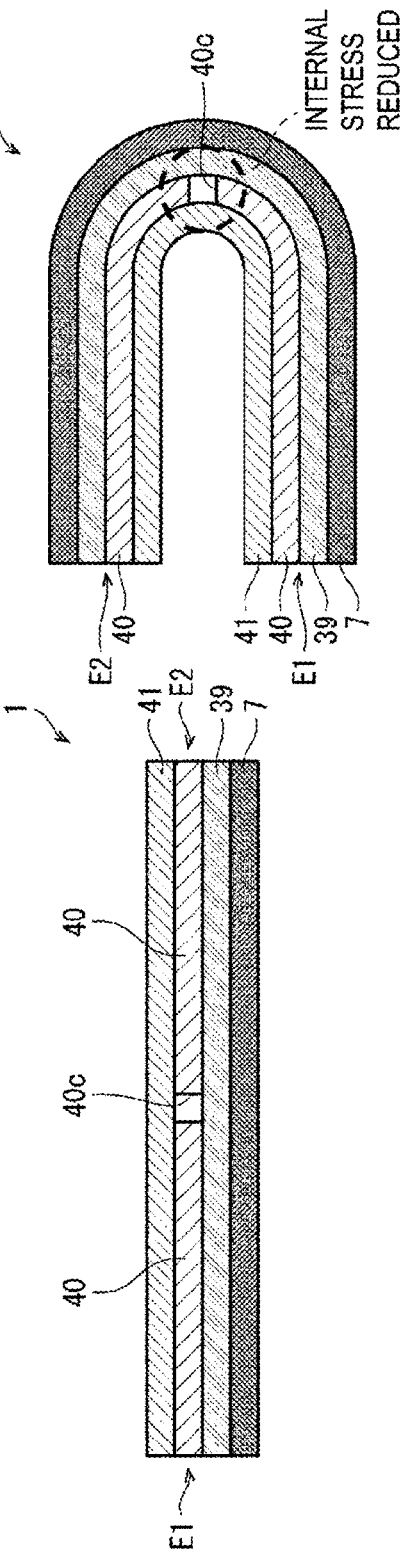

FIG. 4A is a diagram illustrating a schematic configuration of the flexible organic EL display device 1, and FIG. 4B is a diagram illustrating the flexible organic EL display device 1 bent to align the left end portion E1 and the right end portion E2. While FIG. 4B illustrates the flexible organic EL display device 1 bent such that the protection layers 41 face each other, the flexible organic EL display device 1 may be bent such that the layered bodies 7 face each other.

As illustrated in FIG. 4B, in the flexible organic EL display device 1, the opening 40c is formed in the polarizing plate 40, and an internal stress of the bending region R1 when the flexible organic EL display device 1 is bent can be reduced by this opening 40c.

Figure 4C:
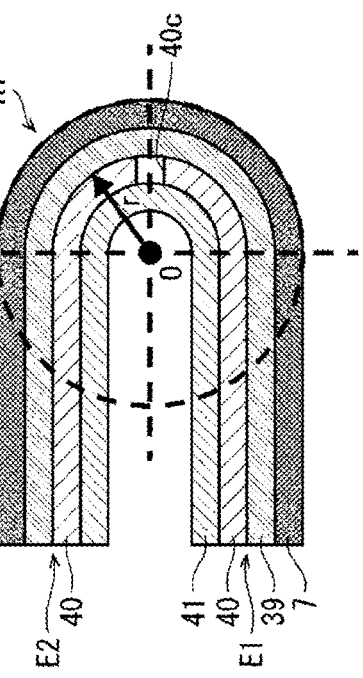

As illustrated in FIG. 4C, the portion formed in a non-planar manner, which is on the right side of the dashed line H in the drawing, is the bending region R1 of the flexible organic EL display device 1. When the flexible organic EL display device 1 is bent such that the protection layers 41 face each other, a radius of curvature r from a center point O increases in the order of the protection layer 41, the polarizing plate 40, the touch panel 39, and the layered body 7 in the bending region RE Further, although not illustrated in the drawings, when the flexible organic EL display device 1 is bent such that the layered bodies 7 face each other, the radius of curvature r from the center point O increases in the order of the layered body 7, the touch panel 39, the polarizing plate 40, and the protection layer 41 in the bending region R1.

Note that while, in the flexible organic EL display device 1, the predetermined value A of the width in the first direction of the opening 40c formed in the polarizing plate 40 is substantially narrower than the width in the first direction of the bending region R1 taking into consideration the narrowing of the display region DA of the flexible organic EL display device 1, the disclosure is not limited thereto. As with a flexible organic EL display device 1' illustrated in FIG. 4D, the predetermined value A of the width in the first direction of the opening 40c formed in the polarizing plate 40 may be widened provided that the widening is within a range in which the display region DA of the flexible organic EL display device 1' is not greatly narrowed and is within a range of the bending region R1.

Furthermore, provided that the display device does not become problematic even when the display region DA of the flexible organic EL display device is narrowed, the predetermined value A of the width in the first direction of the opening 40c formed in the polarizing plate 40 may be greater than the width of the bending region R1.

Figure 4D:
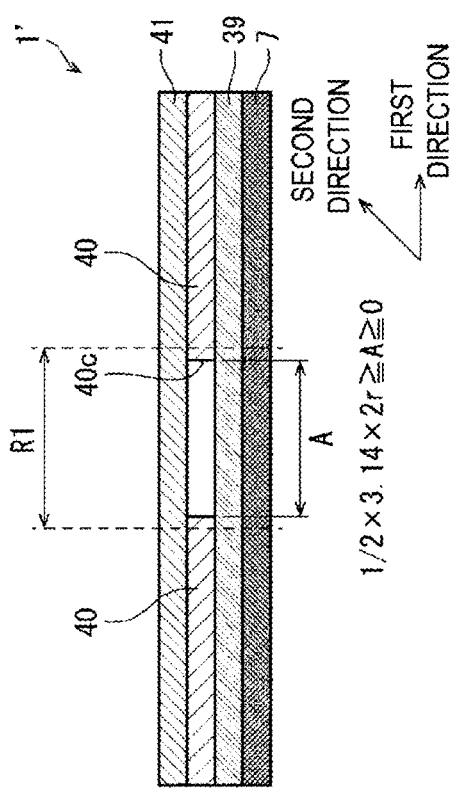

As illustrated in FIGS. 4C and 4D, the preferred predetermined value A of the width in the first direction of the opening 40c formed in the polarizing plate 40 can be found from the following Relationship (1) using the radius of curvature r from the center point O of the polarizing plate 40.

$$\tfrac{1}{2} \times 3.14 \times 2r \geq A \geq 0 \qquad \text{Relationship (1)}$$

When the predetermined value A found by Relationship (1) above is the maximum value, the opening 40c having a width along the bending region R1 illustrated in FIG. 4C is formed in the polarizing plate 40. Further, when the predetermined value A is the minimum value (0), a linear opening is formed as in the fifth embodiment described later.

Note that while, as described above, the flexible organic EL display devices 1 and 1' are bent such that the protection layers 41 face each other or such that the layered bodies 7 face each other, and thus the radius of curvature r from the center point O of the polarizing plate 40 are different. The radius of curvature r used may be mainly in the direction of bending, or the average value of the two different radius of curvature r may be used.

While, in FIG. 1 to FIG. 4D, a case is described in which, in the flexible organic EL display device 1 provided with the touch panel 39 bonded on the layered body 7 via the adhesive layer A3, the internal stress in the bending region R1 when the flexible organic EL display device 1 is bent is reduced by the opening 40c formed in the polarizing plate, the disclosure is not limited thereto. As illustrated in FIGS. 5A to 5H, an opening may be formed in a layer other than the polarizing plate 40, and a layered body 7' may be a flexible organic EL display device including an on-cell touch panel or an in-cell touch panel.

FIGS. 5A to 5H are diagrams illustrating modified examples of the flexible organic EL display device.

Note that, in FIGS. 5A to 5H, adhesive layers, such as the adhesive layers A1 to A3, are not illustrated.

Figure 5A:
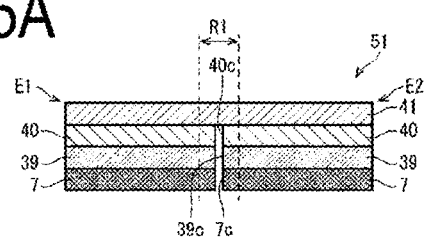
FIGS. 5A to 5H are diagrams illustrating modified examples of the flexible organic EL display device.

FIG. 5A is a diagram illustrating a schematic configuration of a flexible organic EL display device 51. In the flexible organic EL display device 51, an opening 7c, an opening 39c, and the opening 40c are formed in the layered body 7, the touch panel 39, the polarizing plate 40, respectively, in at least a portion of the bending region R1 of each of the layered body 7, the touch panel 39, and the polarizing plate 40.

Note that the shapes of the opening 7c formed in the layered body 7 and the opening 39c formed in the touch panel 39 can be formed in the same manner as that of the opening formed in the polarizing plate (refer to FIGS. 3A to 3C). Further, while, in the present embodiment, an example has been described in which the opening 7c formed in the layered body 7, the opening 39c formed in the touch panel 39, and the opening 40c formed in the polarizing plate 40 have the same shape and are disposed to overlap in a plan view, the disclosure is not limited thereto.

In the case of the flexible organic EL display device 51, the internal stress of the bending region R1 when the flexible organic EL display device 51 is bent can be reduced by the opening 7c, the opening 39c, and the opening 40c.

Figure 5B:
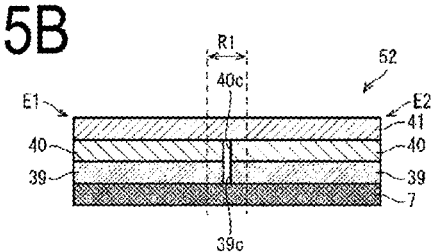

FIG. 5B is a diagram illustrating a schematic configuration of a flexible organic EL display device 52. In the flexible organic EL display device 52, the opening 39c and the opening 40c are formed in the touch panel 39 and the polarizing plate 40, respectively, in at least a portion of the bending region R1 of each of the touch panel 39 and the polarizing plate 40.

Note that the shape of the opening 39c formed in the touch panel 39 can be formed in the same manner as that of the opening formed in the polarizing plate (refer to FIGS. 3A to 3C). Further, while, in the present embodiment, an example has been described in which the opening 39c formed in the touch panel 39 and the opening 40c formed in the polarizing plate 40 have the same shape and are disposed to overlap in a plan view, the disclosure is not limited thereto.

In the case of the flexible organic EL display device 52, the internal stress of the bending region R1 when the flexible organic EL display device 52 is bent can be reduced by the opening 39c and the opening 40c.

Figure 5C:
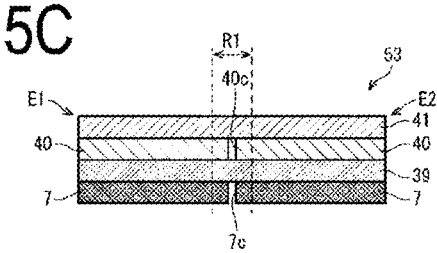

FIG. 5C is a diagram illustrating a schematic configuration of a flexible organic EL display device 53. In the flexible organic EL display device 53, the opening 7c and the opening 40c are formed in the layered body 7 and the polarizing plate 40, respectively, in at least a portion of the bending region R1 of each of the layered body 7 and the polarizing plate 40.

Note that the shape of the opening 7c formed in the layered body 7 can be formed in the same manner as that of the opening formed in the polarizing plate (refer to FIGS. 3A to 3C). Further, while, in the present embodiment, an example has been described in which the opening 7c formed in the layered body 7 and the opening 40c formed in the polarizing plate 40 have the same shape and are disposed to overlap in a plan view, the disclosure is not limited thereto.

In the case of the flexible organic EL display device 53, the internal stress of the bending region R1 when the flexible organic EL display device 53 is bent can be reduced by the opening 7c and the opening 40c.

Figure 5D:
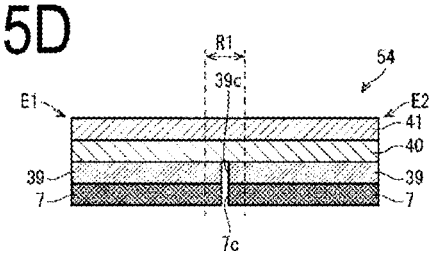

FIG. 5D is a diagram illustrating a schematic configuration of a flexible organic EL display device 54. In the flexible organic EL display device 54, the opening 7c and the opening 39c are formed in the layered body 7 and the touch panel 39, respectively, in at least a portion of the bending region R1 of each of the layered body 7 and the touch panel 39.

Note that the shapes of the opening 7c formed in the layered body 7 and the opening 39c formed in the touch panel 39 can be formed in the same manner as that of the opening formed in the polarizing plate (refer to FIGS. 3A to 3C). Further, while, in the present embodiment, an example has been described in which the opening 7c formed in the layered body 7 and the opening 39c formed in the touch panel 39 have the same shape and are disposed to overlap in a plan view, the disclosure is not limited thereto.

In the case of the flexible organic EL display device 54, the internal stress of the bending region R1 when the flexible organic EL display device 54 is bent can be reduced by the opening 7c and the opening 39c.

Figure 5E:
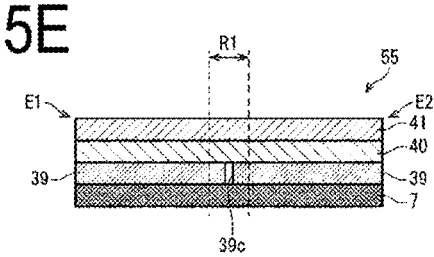

FIG. 5E is a diagram illustrating a schematic configuration of a flexible organic EL display device 55. In the flexible organic EL display device 55, the opening 39c is formed in the touch panel 39 in at least a portion of the bending region R1 of the touch panel 39.

Note that the shape of the opening 39c formed in the touch panel 39 can be formed in the same manner as that of the opening formed in the polarizing plate (refer to FIGS. 3A to 3C).

In the case of the flexible organic EL display device 55, the internal stress of the bending region R1 when the flexible organic EL display device 55 is bent can be reduced by the opening 39c.

Figure 5F:
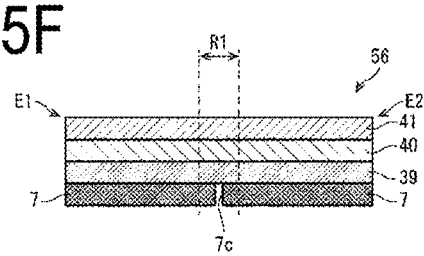

FIG. 5F is a diagram illustrating a schematic configuration of a flexible organic EL display device 56. In the flexible organic EL display device 56, the opening 7c is formed in the layered body 7 in at least a portion of the bending region R1 of the layered body 7.

Note that the shape of the opening 7c formed in the layered body 7 can be formed in the same manner as that of the opening formed in the polarizing plate (refer to FIGS. 3A to 3C).

In the case of the flexible organic EL display device 56, the internal stress of the bending region R1 when the flexible organic EL display device 56 is bent can be reduced by the opening 7c.

Figure 5G:
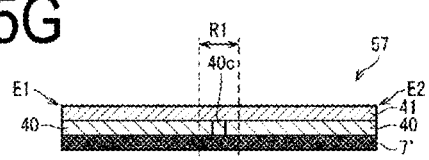

FIG. 5G is a diagram illustrating a schematic configuration of the flexible organic EL display device 57. The flexible organic EL display device 57 includes the layered body 7' including an on-cell touch panel or an in-cell touch panel, the polarizing plate 40, and the protection layer 41.

In the case of the flexible organic EL display device 57, the internal stress of the bending region R1 when the flexible organic EL display device 57 is bent can be reduced by the opening 40c formed in the polarizing plate 40.

Figure 5H:
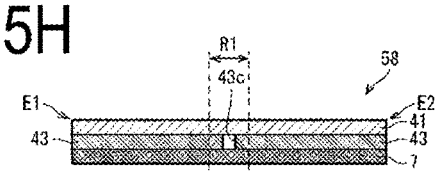

FIG. 5H is a diagram illustrating a schematic configuration of a flexible organic EL display device 58. The flexible organic EL display device 58 includes the layered body 7, a touch panel 43 having a polarization function in which the touch panel and the polarizing plate are integrally formed, and the protection layer 41.

In the flexible organic EL display device 58, an opening 43c is formed in the touch panel 43 having the polarization function, in at least a portion of the bending region R1 of the touch panel 43 having the polarization function.

Note that the shape of the opening 43c formed in the touch panel 43 having the polarization function can be formed in the same manner as that of the opening formed in the polarizing plate (refer to FIGS. 3A to 3C).

In the case of the flexible organic EL display device 58, the internal stress of the bending region R1 when the flexible organic EL display device 58 is bent can be reduced by the opening 43c formed in the touch panel 43 having the polarization function.

Figure 6:
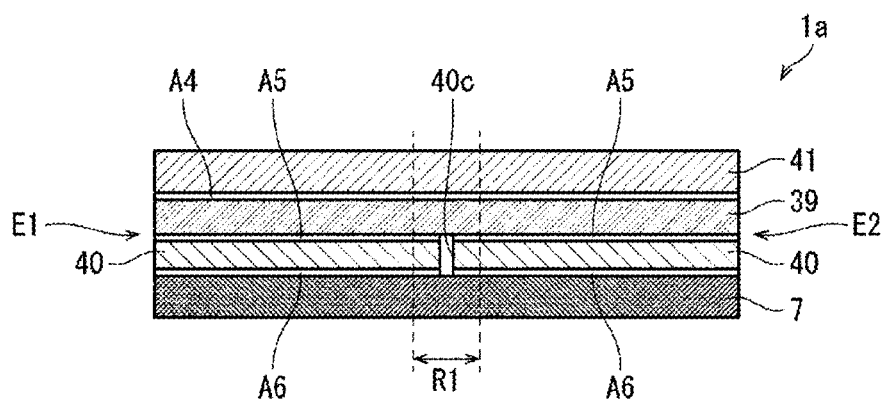
FIG. 6 is a diagram illustrating another modified example of the flexible organic EL display device.

FIG. 6 is a diagram illustrating a schematic configuration of a flexible organic EL display device 1a.

As illustrated, in the flexible organic EL display device 1a, the polarizing plate 40 including the opening 40c is bonded on the layered body 7 via an adhesive layer A6 made of, for example, a glue having a thickness of about from 10 µm to 20 µm. Then, the touch panel 39 is bonded on the polarizing plate 40 via an adhesive layer A5 made of OCA or OCR, and the protection layer 41 is bonded as a top layer on the touch panel 39 via an adhesive layer A4 made of OCA or OCR.

Then, in the flexible organic EL display device 1a, the opening 40c is formed in at least a portion of the bending region R1 of the polarizing plate 40.

Note that, although not illustrated, in the case of the flexible organic EL display device 1a, the modified examples illustrated in FIGS. 5A to 5H can be applied.

As described above, in the bending region R1 of the flexible organic EL display devices 1, 1', 1a, 51, 52, 53, 54, 55, 56, 57 and 58, an opening is formed in at least one layer of the plurality of layers including the layered bodies 7 and 7' being a lower layer below the protection layer 41 and thus, in the flexible organic EL display devices 1, 1', 1a, 51, 52, 53, 54, 55, 56, 57 and 58, stress applied to the bending region R1 of the flexible organic EL display devices 1, 1', 1a, 51, 52, 53, 54, 55, 56, 57 and 58 during bending can be reduced, and bending characteristics such as restoring force, bending mark resistance, and flexibility after being fixed for an extended period of time in a bent state can be improved.

Second Embodiment

Next, description is made of a second embodiment of the disclosure with reference to FIG. 7A to FIG. 10B. The present embodiment differs from the first embodiment in that recesses and protrusions (a recessed and protruding portion) 63, 63a and 63b having a striped shape are formed in at least a portion of the bending region R1 of a polarizing plate 62 provided to a flexible organic EL display device 61. All other components are as described in the first embodiment. For convenience of description, members having the same functions as those of the members illustrated in the drawings in the first embodiment are denoted by the same reference numerals, and descriptions thereof will be omitted.

Figure 7A:
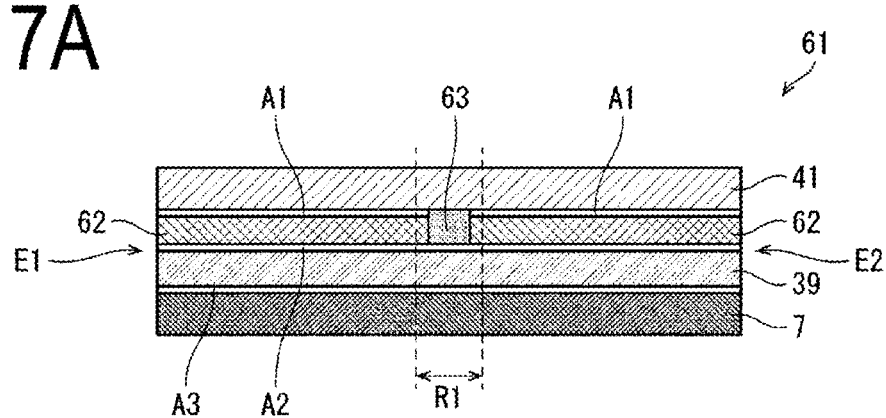
FIG. 7A is a diagram illustrating a schematic configuration of the flexible organic EL display device.
Figure 7B:
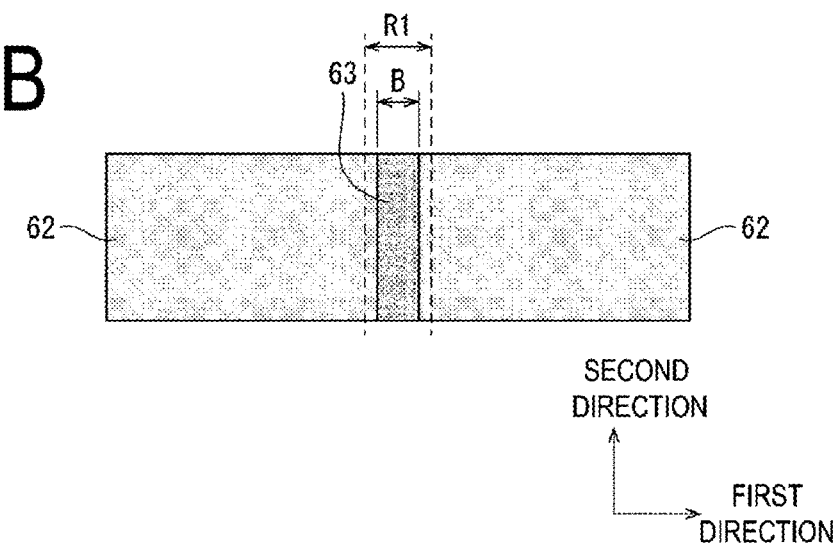
FIG. 7B is a diagram illustrating a case where recesses and protrusions having a striped shape are formed in at least a portion of a bending region of the polarizing plate provided to the flexible organic EL display device.

FIG. 7A is a diagram illustrating a schematic configuration of the flexible organic EL display device 61, and FIG. 7B is a diagram illustrating a case where the recesses and protrusions 63 having a striped shape are formed in at least a portion of the bending region R1 of the polarizing plate 62 provided to the flexible organic EL display device 61.

As illustrated in FIG. 7A, the flexible organic EL display device 61 includes the layered body 7 including a flexible substrate (not illustrated) and an electro-optical element (not illustrated) provided on a surface of one side of the flexible substrate, and a protection layer 41 as a top layer configured to cover the layered body 7. A plurality of layers including the layered body 7 being a lower layer below the protection layer 41 includes the layered body 7, the adhesive layers A1 to A3, the touch panel 39, and the polarizing plate 62.

The touch panel 39 is bonded on this layered body 7 via the adhesive layer A3 made of OCA or OCR, and the polarizing plate 62 including the recesses and protrusions 63 is bonded on the touch panel 39 via the adhesive layer A2 made of a glue or the like having a thickness of about from 10 μm to 20 μm, for example. Then, the protection layer 41 is bonded on the polarizing plate 62 as a top layer via the adhesive layer A1 made of OCA or OCR.

The flexible organic EL display device 61 includes two end portions opposing each other, namely the left end portion E1 and the right end portion E2.

When the flexible organic EL display device 61 is bent to align the left end portion E1 and the right end portion E2 (refer to FIG. 8C), a portion formed in a non-planar manner on a side opposing the left end portion E1 and the right end portion E2 is the bending region R1 indicated by the dashed lines in the drawings.

Then, the recesses and protrusions 63 having a striped shape are formed in at least a portion of the bending region R1 of the polarizing plate 62.

As illustrated in FIG. 7B, the recesses and protrusions 63 having a striped shape are formed in at least a portion of the bending region R1 of the polarizing plate 62 provided to the flexible organic EL display device 61 and, in the present embodiment, a predetermined value B of a width in the first direction of the recesses and protrusions 63 formed on the polarizing plate 62 is smaller than the width in the first direction of the bending region R1. However, the disclosure is not limited thereto.

Note that, in the recesses and protrusions 63, recessed portions and protruding portions formed in the second direction are formed alternately in the first direction.

FIGS. 8A to 8D are diagrams for explaining why the flexible organic EL display device 61 exhibits improvement in bending characteristics such as restoring force, bending mark resistance, and flexibility after being fixed for an extended period of time in a bent state, and a method for determining the preferred predetermined value B of the width of the recesses and protrusions 63 formed in the polarizing plate in the first direction.

Figure 8A:
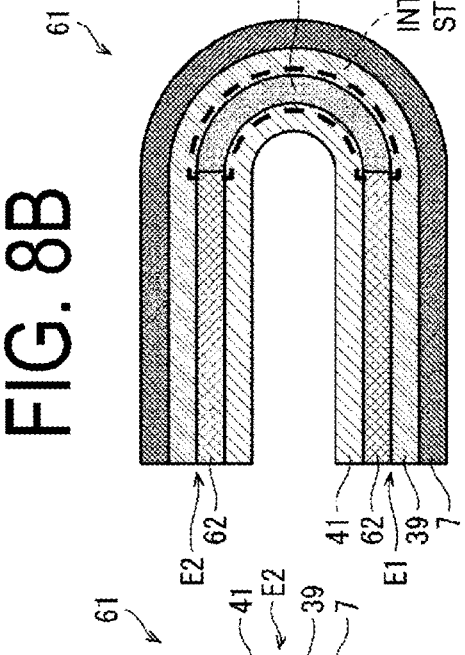
FIGS. 8A to 8D are diagrams for explaining why the flexible organic EL display device exhibits improvement in bending characteristics such as restoring force, bending mark resistance, and flexibility after being fixed for an extended period of time in a bent state, and a method for determining a preferred predetermined value B of a width of the recesses and protrusions formed in the polarizing plate in the first direction.
Figure 8B:
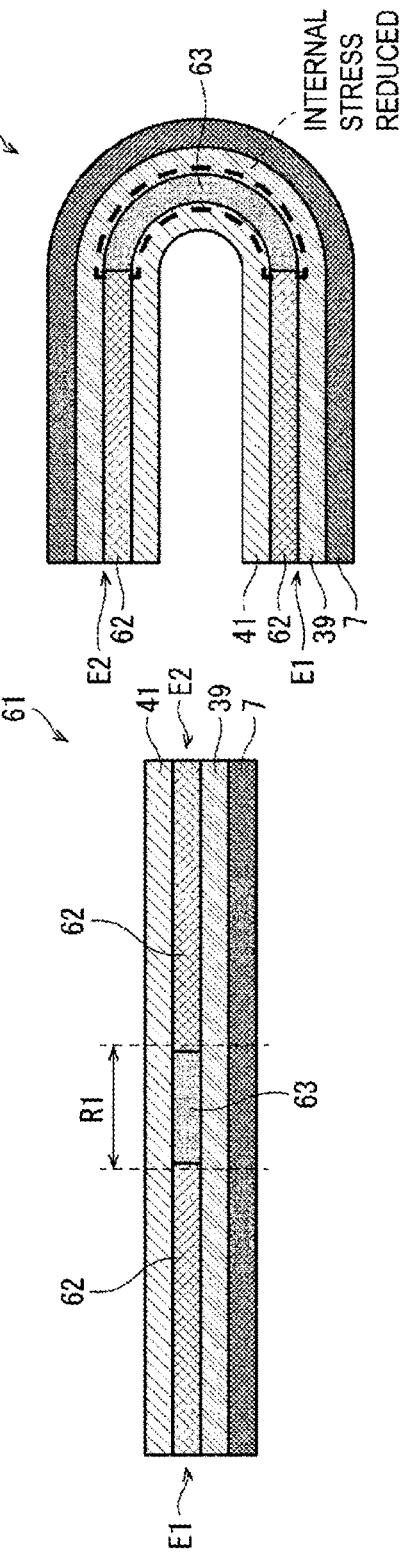

FIG. 8A is a diagram illustrating a schematic configuration of the flexible organic EL display device 61, and FIG. 8B is a diagram illustrating the flexible organic EL display device 61 bent to align the left end portion E1 and the right end portion E2. While FIG. 8B illustrates the flexible organic EL display device 61 bent with the protection layers 41 opposing each other, the flexible organic EL display device 61 may be bent such that the layered bodies 7 face each other.

As illustrated in FIG. 8B, in the flexible organic EL display device 61, the recesses and protrusions 63 are formed in the polarizing plate 40, and an internal stress of the bending region R1 when the flexible organic EL display device 61 is bent can be reduced by the recesses and protrusions 63.

Figure 8D:
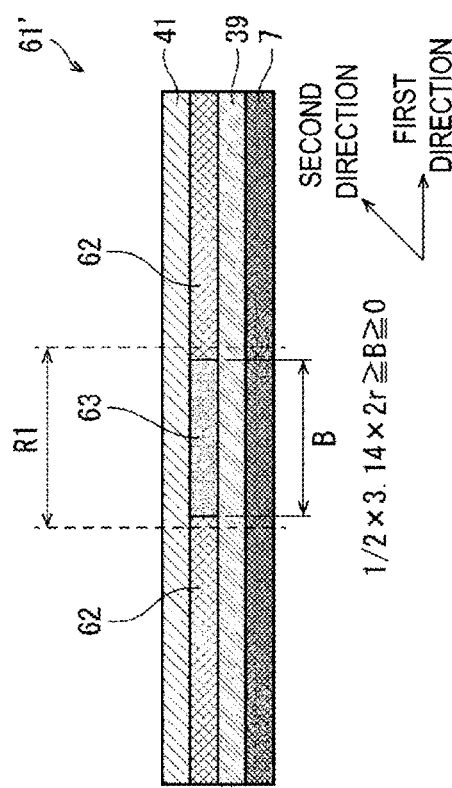
Figure 8C:
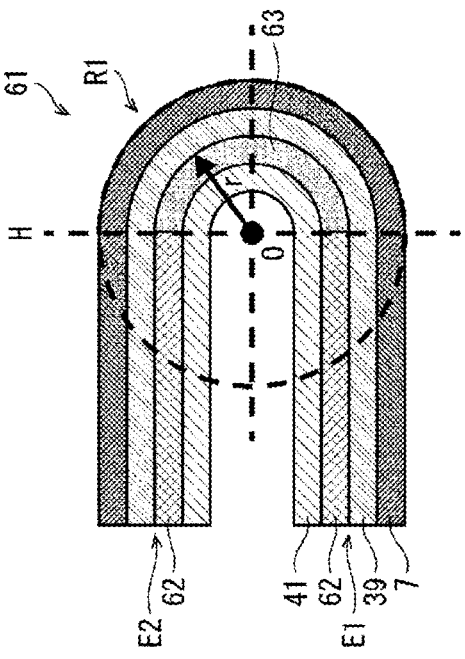

As illustrated in FIG. 8C, the portion formed in a non-planar manner, which is on the right side of the dashed line H in the drawing, is the bending region R1 of the flexible organic EL display device 61. When the flexible organic EL display device 61 is bent such that the protection layers 41 face each other, the radius of curvature r from the center point O increases in the order of the protection layer 41, the polarizing plate 62, the touch panel 39, and the layered body 7 in the bending region R1. Further, although not illustrated in the drawings, when the flexible organic EL display device 61 is bent such that the layered bodies 7 face each other, the radius of curvature r from the center point O increases in the order of the layered body 7, the touch panel 39, the polarizing plate 62, and the protection layer 41 in the bending region R1.

Note that while, in the present embodiment, the predetermined value B of the width in the first direction of a fine processing region where the recesses and protrusions 63 are formed in the polarizing plate 62 is smaller than the width in the first direction of the bending region R1 taking into consideration the narrowing of the display region DA of the flexible organic EL display device 61, the disclosure is not limited thereto. As with a flexible organic EL display device 61' illustrated in FIG. 8D, the predetermined value B of the width in the first direction of the fine processing region where the recesses and protrusions 63 are formed in the polarizing plate 62 may be widened provided that the widening is within a range in which the display region DA of the flexible organic EL display device 61' is not greatly narrowed and is within the range of the bending portion R1.

Furthermore, provided that the display device does not become problematic even when the display region DA of the flexible organic EL display device is narrowed, the predetermined value B of the width in the first direction of the fine processing region in which the recesses and protrusions 63 are formed in the polarizing plate 62 may be greater than the width of the bending region R1.

As illustrated in FIGS. 8C and 8D, the preferred predetermined value B of the width in the first direction of the recesses and protrusions 63 formed in the polarizing plate 62 can be found from the following Relationship (2) using the radius of curvature r from the center point O of the polarizing plate 62.

$$\frac{1}{2} \times 3.14 \times 2r \geq B \geq 0 \qquad \text{Relationship (2)}$$

When the predetermined value B found by Relationship (2) above is the maximum value, the recesses and protrusions 63 having a width along the bending region R1 illustrated in FIG. 8C are formed in the polarizing plate 62. Further, when the predetermined value B is the minimum value (0), a linear recess is formed as in the fifth embodiment described later.

Note that while, as described above, the flexible organic EL display devices 61 and 61' are bent such that the protection layers 41 face each other or such that the layered bodies 7 face each other, and thus the radius of curvature r from the center point O of the polarizing plate 62 are different. The radius of curvature r used may be mainly in the direction of bending, or the average value of the two different radius of curvature r may be used.

Figure 9A:
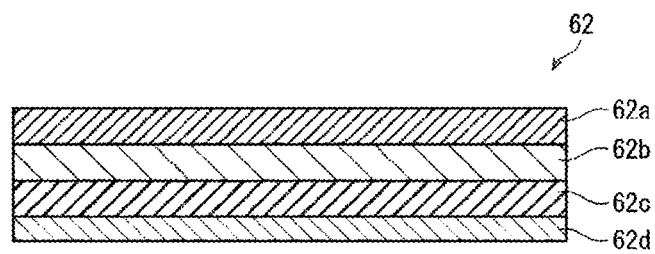
FIG. 9A is a diagram illustrating a schematic configuration of the polarizing plate provided to the flexible organic EL display device.
Figure 9B:
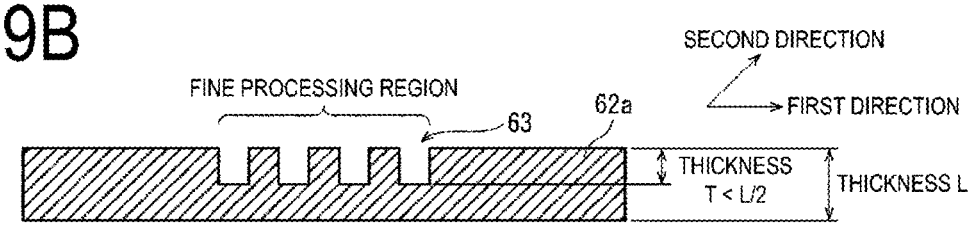
FIG. 9B is a diagram illustrating a case in which recesses and protrusions are formed in a first protection film of the polarizing plate.
Figure 9C:
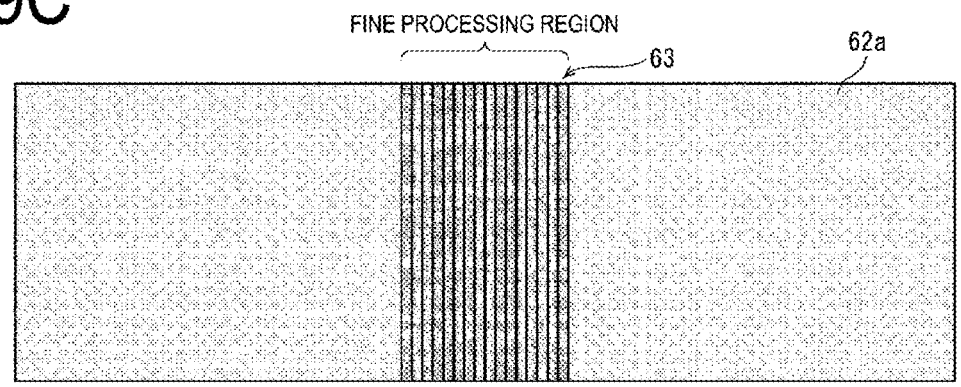
FIG. 9C is a diagram illustrating a fine processing region in which recesses and protrusions are formed in the first protection film of the polarizing plate.
Figure 9C:
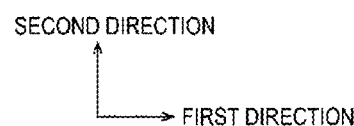

FIG. 9A is a diagram illustrating a schematic configuration of the polarizing plate 62 provided to the flexible organic EL display device 61, FIG. 9B is a diagram illustrating a case in which the recesses and protrusions 63 are formed in a first protection film (protection film) 62a of the polarizing plate 62, and FIG. 9C is a diagram illustrating a fine processing region in which the recesses and protrusions 63 are formed in the first protection film 62a of the polarizing plate 62.

As illustrated in FIG. 9A, the polarizing plate 62 provided to the flexible organic EL display device 61 has a layered structure of the first protection film 62a, a polyvinyl alcohol (PVA) film 62b, a second protection film 62c, and an adhesive layer 62d.

The first protection film 62a is a layer in contact with the protection layer 41, and the adhesive layer 62d is a layer in contact with the touch panel 39.

In the present embodiment, as illustrated in FIG. 9B, the recesses and protrusions 63 are formed in the fine processing region (the region where the width in the first direction is the predetermined value B) of the first protection film 62a of the polarizing plate 62.

Then, a thickness T of the protruding portion of the recesses and protrusions 63 of the first protection film 62a, that is, the thickness T of the protruding portion from a flat portion of the recesses and protrusions 63, is preferably thinner than half (L/2) of a thickness L of the portion other than the recesses and protrusions 63 of the first protection film 62a.

Note that, while the fine processing region where the recesses and protrusions 63 are formed in the first protection film 62a of the polarizing plate 62 is at least a portion of the bending region R1 (not illustrated) in the present embodiment as illustrated in FIG. 9C, the predetermined value B of the width in the first direction of the fine processing region where the recesses and protrusions 63 are formed may be greater than or equal to the width in the first direction of the bending region R1.

As illustrated in FIG. 9B and FIG. 9C, in the recesses and protrusions 63 formed in the first protection film 62a of the polarizing plate 62, recessed portions having a rectangular shape and protruding portions having a rectangular shape formed in the second direction are alternately formed in the first direction.

Figure 10A:
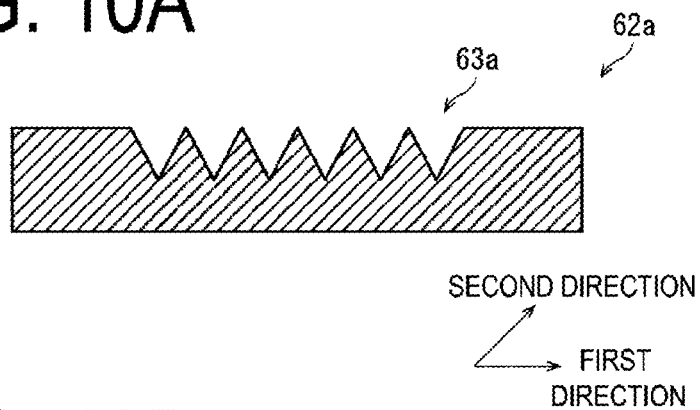
FIGS. 10A and 10B are diagrams illustrating shapes of other recesses and protrusions that can be formed in the first protection film of the polarizing plate.
Figure 10B:
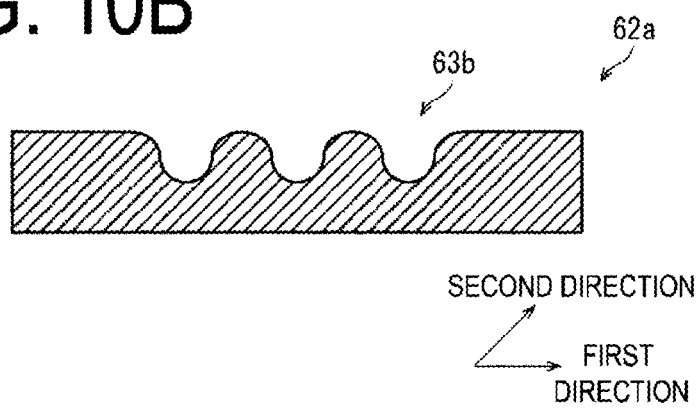

FIGS. 10A and 10B are diagrams illustrating shapes of the other recesses and protrusions 63a and 63b that may be formed in the first protection film 62a of the polarizing plate 62.

As illustrated in FIG. 10A, in the recesses and protrusions 63a formed in the first protection film 62a of the polarizing plate 62, recessed portions having a triangular shape and protruding portions having a triangular shape formed in the second direction are alternately formed in the first direction.

As illustrated in FIG. 10B, in the recesses and protrusions 63b formed in the first protection film 62a of the polarizing plate 62, recessed portions having a round shape and protruding portions having a round shape formed in the second direction are alternately formed in the first direction.

While, in the present embodiment, an example has been described in which the recesses and protrusions 63, 63a and 63b are formed in the first protection film 62a of the polarizing plate 62 as described above, the disclosure is not limited thereto, and the recesses and protrusions 63, 63a and 63b may be formed in a plurality of layers of the polarizing plate 62. For example, the recesses and protrusions 63, 63a and 63b may be formed in the first protection film 62a, the PVA film 62b, and the second protection film 62c.

As described above, in the bending region R1 of the flexible organic EL display device 61, recesses and protrusions are formed in at least one layer of the plurality of layers including the layered body 7 being a lower layer below the protection layer 41, and thus, in the flexible organic EL display devices 61, stress applied to the bending region R1 of the flexible organic EL display device 61 during bending can be reduced, and bending characteristics such as restoring force, bending mark resistance, and flexibility after being fixed for an extended period of time in a bent state can be improved.

Third Embodiment

Next, a third embodiment of the disclosure will be described with reference to FIGS. 11A to 12C. The present embodiment differs from the second embodiment in that recessed portions 64, 65, 66 and 67 of recesses and protrusions (a recessed and protruding portion) 63c, 63d, 63e and 63f formed in at least a portion of the bending region R1 of the polarizing plate 62 are formed into dot-like shapes. All other components are as described in the second embodiment. For convenience of description, members having the same functions as those illustrated in the drawings of the second embodiment are denoted by the same reference signs, and the description thereof will be omitted.

Figure 11A:
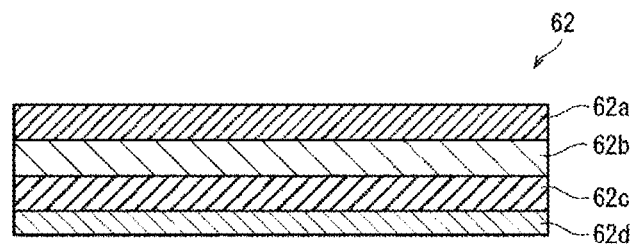
FIG. 11A is a diagram illustrating a schematic configuration of the polarizing plate.
Figure 11B:
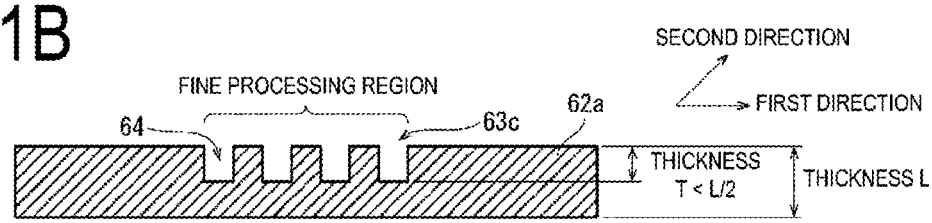
FIG. 11B is a diagram illustrating the case in which recesses and protrusions are formed in the first protection film of the polarizing plate.
Figure 11C:
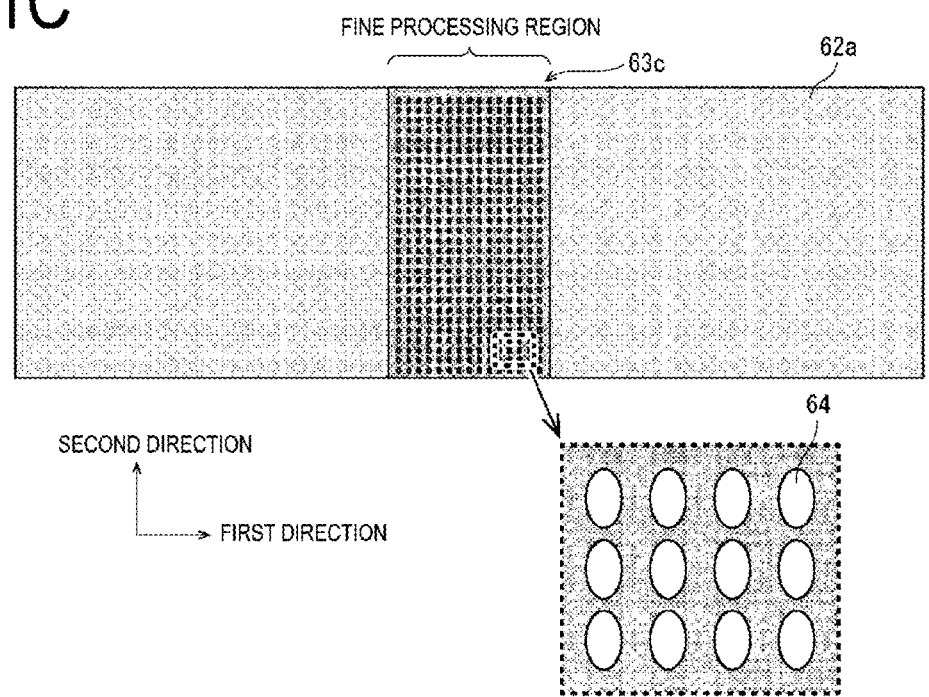
FIG. 11C is a diagram illustrating the fine processing region in which the recesses and protrusions are formed in the first protection film of the polarizing plate.

FIG. 11A is a diagram illustrating a schematic configuration of the polarizing plate 62, FIG. 11B is a diagram illustrating a case in which the recesses and protrusions 63c are formed in the first protection film (protection film) 62a of the polarizing plate 62, and FIG. 11C is a diagram illustrating a fine processing region in which the recesses and protrusions 63c are formed in the first protection film 62a of the polarizing plate 62.

In the present embodiment, the recesses and protrusions 63c are formed in the fine processing region (the region where the width in the first direction is the predetermined value B) of the first protection film 62a of the polarizing plate 62 illustrated in FIGS. 11A to 11C, and the recessed portions 64 of the recesses and protrusions 63c are formed into dot-like shapes.

As illustrated in FIG. 11C, the recessed portions 64 of the recesses and protrusions 63c are formed into an oval shape.

Then, the thickness T of the protruding portion of the recesses and protrusions 63c of the first protection film 62a, that is, the thickness T of the protruding portion from a flat portion of the recesses and protrusions 63 is preferably thinner than half (L/2) of the thickness L of the portion other than the recesses and protrusions 63c of the first protection film 62a.

Note that, while the fine processing region where the recesses and protrusions 63c are formed in the first protection film 62a of the polarizing plate 62 is at least a portion of the bending region R1 (not illustrated) in the present embodiment as illustrated in FIG. 11C, the predetermined value B of the width in the first direction of the fine processing region where the recesses and protrusions 63c are formed may be greater than or equal to the width in the first direction of the bending region R1.

Figure 12A:
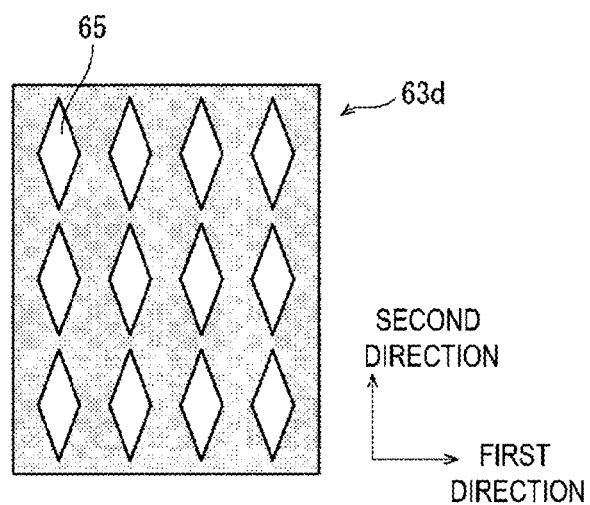
FIGS. 12A to 12C are diagrams illustrating shapes of other recesses and protrusions that can be formed in the first protection film of the polarizing plate.
Figure 12B:
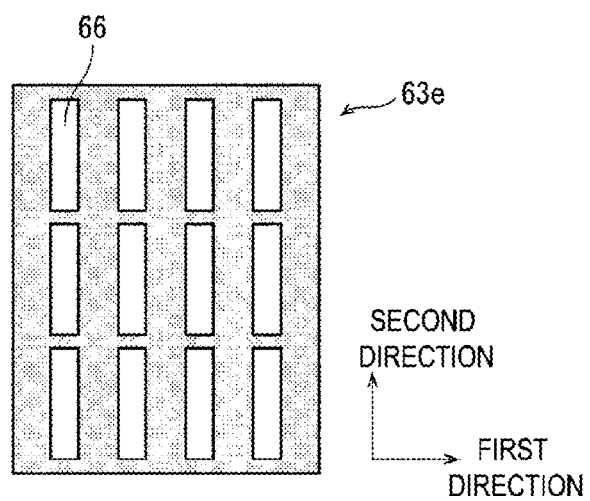
Figure 12C:
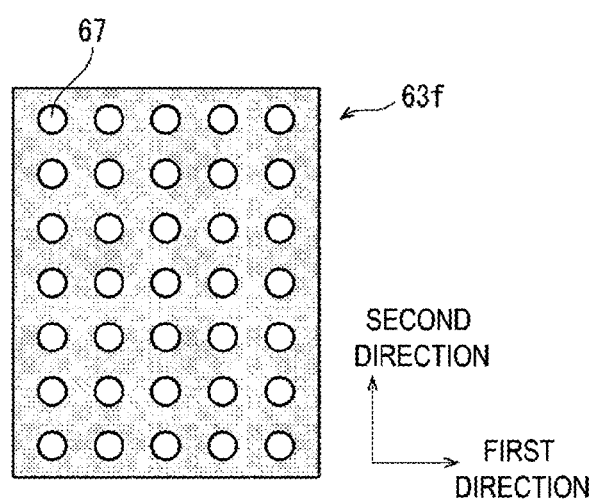

FIGS. 12A to 12C are diagrams illustrating shapes of the other recesses and protrusions 63d, 63e and 63f that can be formed in the first protection film 62a of the polarizing plate 62.

The recessed portions 65 of the recesses and protrusions 63d formed in the first protection film 62a of the polarizing plate 62 illustrated in FIG. 12A are formed into a diamond shape, the recessed portions 66 of the recesses and protrusions 63e formed in the first protection film 62a of the polarizing plate 62 illustrated in FIG. 12B are formed into a rectangular shape, and the recessed portions 67 of the recesses and protrusions 63f formed in the first protection film 62a of the polarizing plate 62 illustrated in FIG. 12C are formed into a circular shape.

While, in the present embodiment, an example has been described in which the recessed portions 64, 65, 66 and 67 of the recesses and protrusions 63c, 63d, 63e and 63f formed in at least a portion of the bending region R1 of the first protection film 62a of the polarizing plate 62 are formed into dot-like shapes in a matrix manner along in the first direction and the second direction, the disclosure is not limited thereto, and the recessed portions 64, 65, 66 and 67 of the recesses and protrusions 63c, 63d, 63e and 63f formed in at least a portion of the bending region R1 of the first protection film 62a of the polarizing plate 62 may be formed into dot-like shapes in a random manner.

Further, while, in the present embodiment, an example has been described in which the recesses and protrusions 63c, 63d, 63e and 63f are formed in the first protection film 62a of the polarizing plate 62, the disclosure is not limited thereto, and the recesses and protrusions 63c, 63d, 63e and 63f may be formed in a plurality of layers of the polarizing plate 62. For example, the recesses and protrusions 63c, 63d, 63e and 63f may be formed in the first protection film 62a, the PVA film 62b, and the second protection film 62c.

Fourth Embodiment

Next, a fourth embodiment of the disclosure will be described with reference to FIG. 13. The present embodiment differs from the first to third embodiments in that a gel material 72 having the same refractive index as that of the polarizing plate 40 is formed in an opening formed in at least a portion of the bending region R1 of the polarizing plate 40. All other components are as described in the first to third embodiments. For convenience of description, members having the same functions as those of the members illustrated in the drawings in the first to third embodiments are denoted by the same reference numerals, and descriptions thereof will be omitted.

Figure 13:
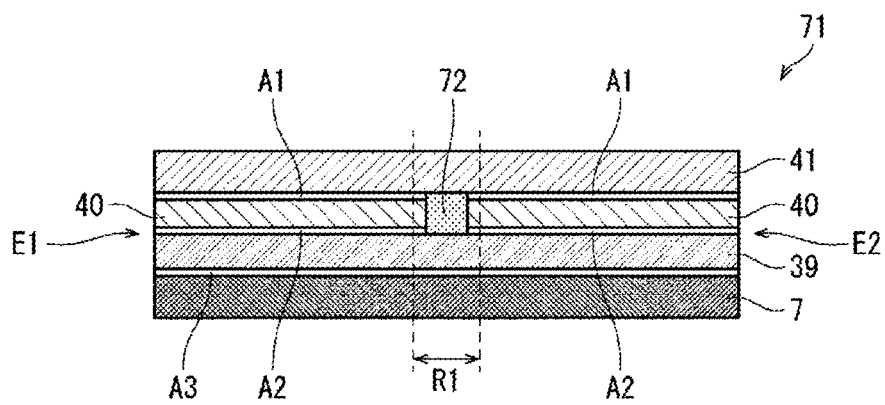
FIG. 13 is a diagram illustrating a schematic configuration of the flexible organic EL display device.

FIG. 13 is a diagram illustrating a schematic configuration of a flexible organic EL display device 71.

As illustrated, in the flexible organic EL display device 71, the gel material 72 having the same refractive index as that of the polarizing plate 40 is formed in an opening formed in at least a portion of the bending region R1 of the polarizing plate 40. The gel material 72 is a material in a gel state having the same refractive index as that of the polarizing plate 40.

With such a configuration, an opening is formed in the flexible organic EL display device 71, making it possible to suppress narrowing of the display region DA.

While, in the present embodiment, an example has been described in which the gel material 72 having the same refractive index as that of the polarizing plate 40 is formed in an opening formed in at least a portion of the bending region R1 of the polarizing plate 40, the disclosure is not limited thereto, and a gel material having the same refractive index as that of an average refractive index of each layer of the touch panel 39 may be formed in an opening formed in at least a portion of the bending region R1 of the touch panel 39, or a gel material having the same refractive index as the average refractive index of each layer of the layered body 7 may be formed in an opening formed in at least a portion of the bending region R1 of the layered body 7.

In the flexible organic EL display device 71, the gel material 72 is formed in at least a portion of the bending region R1, and thus stress applied to the bending region R1 of the flexible organic EL display device 71 during bending can be reduced, and bending characteristics such as restoring force, bending mark resistance, and flexibility after being fixed for an extended period of time in a bent state can be improved.

Note that while a gel material having the same refractive index as the that of the layer in which the opening is formed is used as the gel material 72 formed in the opening in the present embodiment, the disclosure is not limited thereto, and the material may have a refractive index different from that of the layer in which the opening is formed provided that the material is in a gel state.

Thus, even with use of a gel material having a refractive index different from that of the layer in which the opening is formed, it is possible to reduce a stress applied to the bending region of the flexible display device during bending, and thus achieve a flexible display device with improved bending characteristics such as restoring force, bending mark resistance, and flexibility after being fixed for an extended period of time in a bent state.

Fifth Embodiment

Next, a fifth embodiment of the disclosure will be described with reference to FIG. 14. The present embodiment differs from the first to fourth embodiments in that an opening 40d formed in the bending region R1 of the polarizing plate 40 is a linear opening that splits the polarizing plate 40. All other components are as described in the first to fourth embodiments. For convenience of description, members having the same functions as those of the members illustrated in the drawings in the first to fourth embodiments are denoted by the same reference numerals, and descriptions thereof will be omitted.

Figure 14:
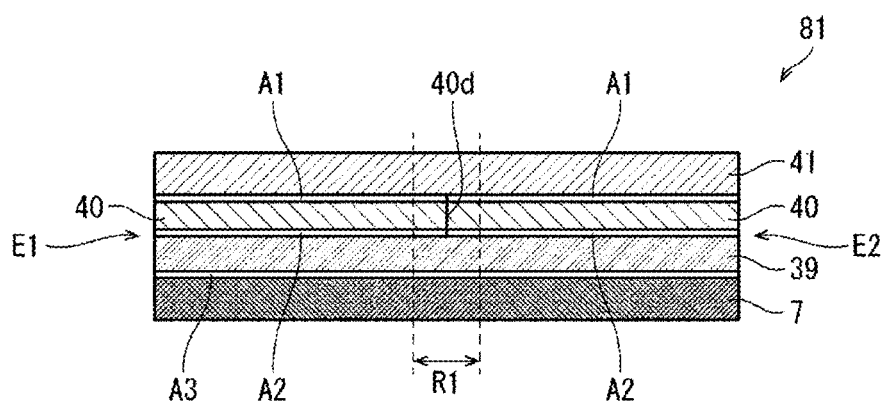
FIG. 14 is a diagram illustrating a schematic configuration of the flexible organic EL display device.

FIG. 14 is a diagram illustrating a schematic configuration of a flexible organic EL display device 81.

As illustrated, in the flexible organic EL display device 81, the opening 40d formed in the bending region R1 of the polarizing plate 40 is a linear opening that splits the polarizing plate 40. That is, the opening 40d is a linear opening without a width in the first direction.

With such a configuration, in the flexible organic EL display device 81, the polarizing plate 40 is split in the bending region R1. Accordingly, stress applied to the bending region R1 of the flexible organic EL display device 81 during bending can be reduced, and bending characteristics such as restoring force, bending mark resistance, and flexibility after being fixed for an extended period of time in a bent state can be improved.

While, in the present embodiment, an example has been described in which the opening 40d is formed in the bending region R1 of the polarizing plate 40, the disclosure is not limited thereto, and a linear opening that splits the touch panel 39 or the layered body 7 may be similarly formed in the bending region R1 of the touch panel 39 or the layered body 7.

Note that the flexible display (flexible display device) according to the present embodiment is not particularly limited as long as the display panel is flexible and provided with flexible electro-optical elements. The electro-optical element described above includes an electro-optical element having luminance or a transmittance controlled by current and an electro-optical element having luminance or a transmittance controlled by voltage. Examples of the current-controlled electro-optical element include organic electroluminescent (EL) displays equipped with organic light-emitting diodes (OLED), EL displays such as inorganic EL displays provided with inorganic light-emitting diodes, and quantum dot light-emitting diode (QLED) displays equipped with QLED. Further, the electro-optical element controlled by voltage can be, for example, a liquid crystal display element or the like.

Supplement

A flexible display device according to a first aspect of the disclosure, to solve the above-described problems, includes a layered body including a flexible substrate and a plurality of electro-optical elements provided on a surface on one side of the flexible substrate, and a protection layer as a top layer configured to cover the layered body. When a plurality of layers including the layered body being a lower layer below the protection layer as well as the protection layer are bent to align two end portions opposing each other, a portion formed in a non-planar manner on a side opposing the two end portions is a bending region and, in at least one layer of the plurality of layers, an opening or a recessed and protruding portion is formed in at least a portion of the bending region of the at least one layer of the plurality of layers.

According to the configuration described above, in at least one layer of the plurality of layers, an opening or a recessed and protruding portion is formed in at least a portion of the bending region of the at least one layer of the plurality of layers, making it possible to reduce a stress applied to the bending region of the flexible display device during bending and thus achieve a flexible display device with improved bending characteristics such as restoring force, bending mark resistance, and flexibility after being fixed for an extended period of time in a bent state.

According to the flexible display device according to a second aspect of the disclosure, in the first aspect, the plurality of layers may include the layered body, a touch panel, and a polarizing plate, and at least one of the layered body, the touch panel, and the polarizing plate may include an opening or a recessed and protruding portion formed in at least a portion of the bending region.

According to the configuration described above, an opening or a recessed and protruding portion is formed in the bending region of the flexible display device, making it possible to reduce a stress applied to the bending region of the flexible display device during bending, and thus achieve a flexible display device with improved bending characteristics such as restoring force, bending mark resistance, and flexibility after being fixed for an extended period of time in a bent state.

According to the flexible display device according to a third aspect of the disclosure, in the second aspect, at least one of the layered body, the touch panel, and the polarizing plate may be split by one opening formed in at least a portion of the bending region.

According to the above-described configuration, in the bending region of the flexible display device, at least one of the layered body, the touch panel, and the polarizing plate is split by an opening, making it possible to reduce a stress applied to the bending region of the flexible display device during bending, and thus achieve a flexible display device with improved bending characteristics such as restoring force, bending mark resistance, and flexibility after being fixed for an extended period of time in a bent state.

According to the flexible display device according to a fourth aspect of the disclosure, in the second aspect, at least one of the layered body, the touch panel, and the polarizing plate may include one opening formed in at least a portion of the bending region.

According to the configuration described above, in the bending region of the flexible display device, at least one of the layered body, the touch panel, and the polarizing plate includes an opening being formed, making it possible to reduce a stress applied to the bending region of the flexible display device during bending, and thus achieve a flexible display device with improved bending characteristics such as restoring force, bending mark resistance, and flexibility after being fixed for an extended period of time in a bent state.

According to the flexible display device according to a fifth aspect of the disclosure, in the second aspect, at least one of the layered body, the touch panel, and the polarizing plate may include a plurality of openings formed, in at least a portion of the bending region, in a second direction orthogonal to a first direction orthogonal to each of the two end portions opposing each other.

According to the configuration described above, in the bending region of the flexible display device, at least one of the layered body, the touch panel, and the polarizing plate includes a plurality of openings formed along the second direction, making it possible to reduce a stress applied to the bending region of the flexible display device during bending, and thus achieve a flexible display device with improved bending characteristics such as restoring force, bending mark resistance, and flexibility after being fixed for an extended period of time in a bent state.

According to the flexible display device according to a sixth aspect of the disclosure, in the third or fourth aspect, a length of the one opening in a first direction orthogonal to each of the two end portions opposing each other may be a length along the bending region of the at least one layer of the plurality of layers of the bending region when bent to align the two end portions opposing each other.

According to the configuration described above, it is possible to further reduce a stress applied to the bending region of the flexible display device during bending while suppressing narrowing of a display region, and thus achieve a flexible display device with improved bending characteristics such as restoring force, bending mark resistance, and flexibility after being fixed for an extended period of time in a bent state.

According to the flexible display device according to a seventh aspect of the disclosure, in the fifth aspect, a length of each of the plurality of openings in the first direction may be a length along the bending region of the at least one layer of the plurality of layers of the bending region when bent to align the two end portions opposing each other.

According to the configuration described above, it is possible to further reduce a stress applied to the bending region of the flexible display device during bending while suppressing narrowing of a display region, and thus achieve a flexible display device with improved bending characteristics such as restoring force, bending mark resistance, and flexibility after being fixed for an extended period of time in a bent state.

According to the flexible display device according to an eighth aspect of the disclosure, in the third or fourth aspect, a length of the one opening in a first direction orthogonal to each of the two end portions opposing each other may be ½×3.14×2r or less, where r is a radius of curvature of the at least one layer of the plurality of layers of the bending region when bent to align the two end portions opposing each other.

According to the configuration described above, the length of the one opening in the first direction can be optimized.

According to the flexible display device according to a ninth aspect of the disclosure, in any one of the second to eighth aspects, the touch panel may be included in the layered body including the plurality of electro-optical elements.

According to the configuration described above, a flexible display device including an in-cell touch panel can be achieved.

According to the flexible display device according to a tenth aspect of the disclosure, in any one of the second to eighth aspects, the touch panel may be formed directly on the layered body including the plurality of electro-optical elements.

According to the configuration described above, a flexible display device including an on-cell touch panel can be achieved.

According to the flexible display device according to an eleventh aspect of the disclosure, in any one of the second to eighth aspects, the touch panel may be formed integrally with the polarizing plate.

According to the configuration described above, a flexible display device including a touch panel having a polarization function in which the touch panel and the polarizing plate are integrally formed can be achieved.

According to the flexible display device according to a twelfth aspect of the disclosure, in the second aspect, the recessed and protruding portion may be formed in at least a portion of the bending region of the polarizing plate.

According to the configuration described above, the recessed and protruding portion is formed in the bending region of the polarizing plate provided to the flexible display device, making it possible to reduce a stress applied to the bending region of the flexible display device during bending, and thus achieve a flexible display device with improved bending characteristics such as restoring force, bending mark resistance, and flexibility after being fixed for an extended period of time in a bent state.

According to the flexible display device according to a thirteenth aspect of the disclosure, in the twelfth aspect, the polarizing plate may have a layered structure, one side of the polarizing plate may be an adhesive layer, the other side of the polarizing plate opposite to the one side of the polarizing plate may be a protection film, and the recessed and protruding portion may be formed in at least a portion of the bending region of the protection film.

According to the configuration described above, the recessed and protruding portion is formed in the bending region of the protection film of the polarizing plate provided to the flexible display device, making it possible to reduce a stress applied to the bending region of the flexible display device during bending, and thus achieve a flexible display device with improved bending characteristics such as restoring force, bending mark resistance, and flexibility after being fixed for an extended period of time in a bent state.

According to the flexible display device according to a fourteenth aspect of the disclosure, in the thirteenth aspect, the recessed and protruding portion may be linearly formed in a second direction orthogonal to a first direction orthogonal to each of the two end portions opposing each other.

According to the configuration described above, it is possible to reduce a stress applied to the bending region of the flexible display device during bending, and thus achieve a flexible display device with improved bending characteristics such as restoring force, bending mark resistance, and flexibility after being fixed for an extended period of time in a bent state.

According to the flexible display device according to a fifteenth aspect of the disclosure, in the thirteenth or fourteenth aspect, a thickness of a protruding portion from a recessed portion in the recessed and protruding portion of the protection film may be thinner than half a thickness of the protection film.

According to the configuration described above, it is possible to reduce a stress applied to the bending region of the flexible display device during bending, and thus achieve a flexible display device with improved bending characteristics such as restoring force, bending mark resistance, and flexibility after being fixed for an extended period of time in a bent state.

According to the flexible display device according to a sixteenth aspect of the disclosure, in any one of the thirteenth to fifteenth aspects, the recessed and protruding portion of the protection film may be formed into any one of a triangular shape, a rectangular shape, or a round shape.

According to the configuration described above, it is possible to reduce a stress applied to the bending region of the flexible display device during bending, and thus achieve a flexible display device with improved bending characteristics such as restoring force, bending mark resistance, and flexibility after being fixed for an extended period of time in a bent state.

According to the flexible display device according to a seventeenth aspect of the disclosure, in the thirteenth aspect, the recessed portion of the recessed and protruding portion may be formed into a dot-like shape.

According to the configuration described above, it is possible to reduce a stress applied to the bending region of the flexible display device during bending, and thus achieve a flexible display device with improved bending characteristics such as restoring force, bending mark resistance, and flexibility after being fixed for an extended period of time in a bent state.

According to the flexible display device according to an eighteenth aspect of the disclosure, in the seventeenth aspect, a thickness of a protruding portion from a recessed portion in the recessed and protruding portion may be thinner than half a thickness of the protection film.

According to the configuration described above, it is possible to reduce a stress applied to the bending region of the flexible display device during bending, and thus achieve a flexible display device with improved bending characteristics such as restoring force, bending mark resistance, and flexibility after being fixed for an extended period of time in a bent state.

According to the flexible display device according to a nineteenth aspect of the disclosure, in the seventeenth or eighteenth aspect, the recessed portion formed into the dot-like shape may be formed into any one of an oval shape, a diamond shape, a rectangular shape, or a circular shape.

According to the configuration described above, it is possible to reduce a stress applied to the bending region of the flexible display device during bending, and thus achieve a flexible display device with improved bending characteristics such as restoring force, bending mark resistance, and flexibility after being fixed for an extended period of time in a bent state.

According to the flexible display device according to a twentieth aspect of the disclosure, in any one of the twelfth to nineteenth aspects, a length of the recessed and protruding portion in a first direction orthogonal to each of the two end portions opposing each other may be a length along the bending region of the polarizing plate in the bending region when bent to align the two end portions opposing each other.

According to the configuration described above, it is possible to further reduce a stress applied to the bending region of the flexible display device during bending while suppressing narrowing of a display region, and thus achieve a flexible display device with improved bending characteristics such as restoring force, bending mark resistance, and flexibility after being fixed for an extended period of time in a bent state.

According to the flexible display device according to a twenty-first aspect of the disclosure, in any one of the twelfth to nineteenth aspects, a length of the recessed and protruding portion in a first direction orthogonal to each of the two end portions opposing each other may be ½×3.14× 2r or less, where r is a radius of curvature of the polarizing plate in the bending region when bent to align the two end portions opposing each other.

According to the configuration described above, the length of the recessed and protruding portion can be optimized.

A flexible display device according to a twenty-second aspect of the disclosure includes a layered body including a flexible substrate and a display element provided on a surface on one side of the flexible substrate, and a protection layer as a top layer configured to cover the layered body. When a plurality of layers including the layered body being a lower layer below the protection layer as well as the protection layer are bent to align two end portions opposing each other, a portion formed in a non-planar manner on a side opposing the two end portions is a bending region, an opening is formed in at least a portion of the bending region of at least one of the plurality of layers, and a gel material is formed in the opening.

According to the above-described configuration, a gel material is formed in an opening of the bending region of the flexible display device, making it possible to reduce a stress applied to the bending region of the flexible display device during bending, and thus achieve a flexible display device with improved bending characteristics such as restoring force, bending mark resistance, and flexibility after being fixed for an extended period of time in a bent state.

According to the flexible display device according to a twenty-third aspect of the disclosure, in the twenty-second aspect, the gel material preferably has the same refractive index as that of the layer of the plurality of layers including the opening.

According to the configuration described above, it is possible to further reduce a stress applied to the bending region of the flexible display device during bending while suppressing narrowing of a display region, and thus achieve a flexible display device with improved bending characteristics such as restoring force, bending mark resistance, and flexibility after being fixed for an extended period of time in a bent state.

According to the flexible display device according to a twenty-fourth aspect of the disclosure, in the third aspect, the one opening may be a linear opening configured to split at least one of the layered body including the plurality of display elements, the touch panel, and the polarizing plate.

According to the configuration described above, it is possible to further reduce a stress applied to the bending region of the flexible display device during bending while suppressing narrowing of a display region, and thus achieve a flexible display device with improved bending characteristics such as restoring force, bending mark resistance, and flexibility after being fixed for an extended period of time in a bent state.

According to the flexible display device of a twenty-fifth aspect of the disclosure, in any one of the first to twenty-fourth aspects, the plurality of display elements may each be, or the display element may be, an organic EL light-emitting element or a reflection-type liquid crystal display element.

According to the configuration described above, it is possible to further reduce a stress applied to the bending region of the flexible display device during bending, and thus achieve an organic EL light-emitting element with improved bending characteristics such as restoring force, bending mark resistance, and flexibility after being fixed for an extended period of time in a bent state or a flexible display device provided with a reflection-type liquid crystal display element.

Additional Items

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

INDUSTRIAL APPLICABILITY

The disclosure can be utilized in a flexible display device.

REFERENCE SIGNS LIST

1 Flexible organic EL display device (flexible display device)

1' Flexible organic EL display device (flexible display device)
5 Organic EL light-emitting element (display element)
7 Layered body
7' Layered body
7c Opening
10 Flexible substrate
39 Touch panel
39c Opening
40 Polarizing plate
40' Polarizing plate
40c Opening
40c' Opening
40d Opening
41 Protection layer
42 Polarizing plate
42c Opening
43 Touch panel with polarization function
51 to 58 Flexible organic EL display device (flexible display device)
61 Flexible organic EL display device (flexible display device)
62 Polarizing plate
62a First protection film (protection film)
62b Polyvinyl alcohol (PVA) film
62c Second protection film
62d Adhesive layer
63 Recesses and protrusions (recessed and protruding portion)
63a Recesses and protrusions (recessed and protruding portion)
63b Recesses and protrusions (recessed and protruding portion)
63c Recesses and protrusions (recessed and protruding portion)
63d Recesses and protrusions (recessed and protruding portion)
63e Recesses and protrusions (recessed and protruding portion)
63f Recesses and protrusions (recessed and protruding portion)
64 Recessed portion
65 Recessed portion
66 Recessed portion
67 Recessed portion
71 Flexible organic EL display device (flexible display device)
72 Gel material
81 Flexible organic EL display device (flexible display device)
E1 Left end portion (end portion)
E2 Right end portion (end portion)
R1 Bending region
A Width of opening in first direction
B Width of recesses and protrusions in first direction

The invention claimed is:

1. A flexible display device comprising:
a layered body including a flexible substrate and a plurality of electro-optical elements provided on a surface on one side of the flexible substrate; and
a protection layer as a top layer configured to cover the layered body, wherein
the layered body includes a first electrode, an organic insulating film covering an edge of the first electrode, an EL layer including a light-emitting layer provided in a layer above the first electrode, and a second electrode provided in a layer above the EL layer,
when a plurality of layers including the layered body in a lower layer below the protection layer and the protection layer are bent to align two end portions opposing each other, a portion defined in a non-planar manner on a side opposing the two end portions is a bending region,
the plurality of layers include the layered body, a touch panel, and a polarizing plate,
in the polarizing plate, an opening or a recessed and protruding portion is provided in at least a portion of the bending region of the polarizing plate, and
an entirety of the opening or the recessed and protruding portion in the polarizing plate overlaps the organic insulating film in a plan view.

2. The flexible display device according to claim 1, wherein the polarizing plate is split by the opening formed in at least the portion of the bending region.

3. The flexible display device according to claim 2, wherein a length of the opening in a first direction orthogonal to each of the two end portions opposing each other is a length along the bending region of the polarizing plate of the bending region when bent to align the two end portions opposing each other.

4. The flexible display device according to claim 2, wherein a length of the one opening in a first direction orthogonal to each of the two end portions opposing each other is $\frac{1}{2} \times 3.14 \times 2r$ or less, where r is a radius of curvature of the polarizing plate of the bending region when bent to align the two end portions opposing each other.

5. The flexible display device according to claim 1, wherein the polarizing plate includes the opening formed in at least a portion of the bending region.

6. The flexible display device according to claim 1, wherein the polarizing plate includes additional openings formed, in at least the portion of the bending region, in a second direction orthogonal to a first direction orthogonal to each of the two end portions opposing each other.

7. The flexible display device according claim 6, wherein a length of each of the additional openings in the first direction is a length along the bending region of the polarizing plate of the bending region when bent to align the two end portions opposing each other.

8. The flexible display device according to claim 1, wherein the touch panel is included in the layered body including the plurality of electro-optical elements.

9. The flexible display device according to claim 1, wherein the touch panel is formed directly on the layered body including the plurality of electro-optical elements.

10. The flexible display device according to claim 1, wherein the touch panel is formed integrally with the polarizing plate.

11. The flexible display device according to claim 1, wherein the recessed and protruding portion is formed in at least a portion of the bending region of the polarizing plate.

12. The flexible display device according to claim 11, wherein a length of the recessed and protruding portion in a first direction orthogonal to each of the two end portions opposing each other is $\frac{1}{2} \times 3.14 \times 2r$ or less, where r is a radius of curvature of the polarizing plate in the bending region when bent to align the two end portions opposing each other.

13. The flexible display device according to claim 11, wherein the polarizing plate has a layered structure, one side of the polarizing plate is an adhesive layer, and the other side of the polarizing plate opposite to the one side of the polarizing plate is a protection film, and the recessed and protruding portion is formed in at least a portion of the bending region of the protection film.

14. The flexible display device according to claim 13, wherein the recessed and protruding portion is linearly formed in a second direction orthogonal to a first direction orthogonal to each of the two end portions opposing each other.

15. The flexible display device according to claim 13, wherein a thickness of a protruding portion from a recessed portion in the recessed and protruding portion of the protection film is thinner than half a thickness of the protection film.

16. The flexible display device according to claim 13, wherein the recessed and protruding portion of the protection film is formed into any one of a triangular shape, a rectangular shape, or a round shape.

17. The flexible display device according to claim 13, wherein the recessed portion of the recessed and protruding portion is formed into a dot-like shape.

18. The flexible display device according to claim 17, wherein a thickness of a protruding portion from a recessed portion in the recessed and protruding portion is thinner than half a thickness of the protection film.

19. A flexible display device comprising:
a layered body including a flexible substrate and an electro-optical element provided on a surface on one side of the flexible substrate; and
a protection layer as a top layer configured to cover the layered body, wherein
the layered body includes a first electrode, an organic insulating file covering an edge of the first electrode, an EL layer including a light-emitting layer provided in a layer above the first electrode, and a second electrode provided in a layer above the EL layer,
when a plurality of layers including the layered body in a lower layer below the protection layer and the protection layer are bent to align two end portions opposing each other, a portion defined in a non-planar manner on a side opposing the two end portions is a bending region,
the plurality of layers include the layered body, a touch panel, and a polarizing plate,
an opening is defined in at least a portion of the bending region of the polarizing plate,
a gel material is provided in the opening, and
an entirety of the opening in the polarizing plate overlaps the organic insulating film in a plan view.

* * * * *